(12) United States Patent
Wang et al.

(10) Patent No.: US 7,105,416 B2
(45) Date of Patent: Sep. 12, 2006

(54) METHOD FOR CONTROLLING THE TOP WIDTH OF A TRENCH

(75) Inventors: Jiann-Jong Wang, Taipei Hsien (TW); Ping Hsu, Taipei Hsien (TW)

(73) Assignee: Nanya Technology Corporation, Taoyuan (TW)

( * ) Notice: Subject to any disclaimer, the term of this patent is extended or adjusted under 35 U.S.C. 154(b) by 43 days.

(21) Appl. No.: 10/643,115

(22) Filed: Aug. 18, 2003

(65) Prior Publication Data

US 2004/0241953 A1    Dec. 2, 2004

(30) Foreign Application Priority Data

May 30, 2003  (TW) ................. 92114693 A

(51) Int. Cl.
*H01L 21/20* (2006.01)
(52) U.S. Cl. ...................... 438/386; 438/243
(58) Field of Classification Search ........... 438/386, 438/387, 243, 244–249, 212, 268, 242, 259, 438/270, 587–589, 388–392; 257/301, 330–333, 257/329, 302, 296, 513, 520
See application file for complete search history.

(56) References Cited

U.S. PATENT DOCUMENTS 6,605,504 B1 *  8/2003  JaiPrakash et al. ......... 438/243

* cited by examiner

*Primary Examiner*—Hoai Pham
*Assistant Examiner*—Dilinh Nguyen
(74) *Attorney, Agent, or Firm*—Quintero Law Office

(57) ABSTRACT

A method for controlling the top width of a trench. A conductive layer is formed on the trench over the substrate, forming an interlayer over a part thereof, above the conductive layer. A sacrifice layer is formed on the trench sidewall above the interlayer, and the interlayer is removed to expose the trench sidewall above the conductive layer and the sacrifice layer, such that the exposed trench sidewalls are oxidized. Thus, the sacrifice layer on the trench sidewall reduces the top width of the trench. In the oxidization process, silicon oxide is formed on the sacrifice layer and the exposed trench sidewall, such that upper width of the trench will is not increased during subsequent wet etching.

10 Claims, 25 Drawing Sheets

METHOD FOR CONTROLLING THE TOP WIDTH OF A TRENCH

BACKGROUND OF THE INVENTION

1. Field of the Invention

The present invention relates to a method for fabricating a deep trench capacitor, and more particularly, to a method for controlling the upper width of a trench.

2. Description of the Related Art

A DRAM cell comprises a transistor and a capacitor. In order to shrink memory cell size, reduce power consumption and increase speed, the 3 D capacitor of the DRAM cell is formed in the semiconductor as the deep trench capacitor combined with a transistor.

FIG. 1A is a plan view showing the deep trench capacitor of a DRAM. Each active area of the folded bit line structure comprises two word lines (WL1 and WL2) and one bit line and DT indicates the deep trench and CB indicated the bit line contact plug.

FIG. 1B is a cross-section of the deep trench capacitor of the DRAM. The deep trench (DT) is formed in the semiconductor substrate 10 and a trench capacitor 12 is formed at the bottom of the deep trench which comprising a buried plate, a node dielectric and a storage node.

The process steps of the deep trench capacitor 12 are described as follows: The deep trench (DT) is formed in the p-type semiconductor substrate 10 by reactive ion etching (RIE). N-type ions are diffused into the bottom of the deep trench DT to form a n-type diffusion area 14 used as the buried plate by diffusing heavily doped materials such as ASG with the rapid thermal method (RTP). Thereafter, a silicon nitride layer 16 is formed on the sidewall and bottom of the deep trench (DT) used as the node dielectric of the deep trench capacitor. A first poly silicon layer 18 is deposited in the deep trench and then etched back to a target depth, which is used as the storage node of the deep trench capacitor 12.

The collar dielectric layer 20 is formed on the upper sidewall of the deep trench (DT). The n-type doped second poly silicon layer and the third poly silicon layer 24 are formed thereafter. Further, the shallow trench isolation (STI) 26, the word lines (WL1 and WL2), the source/drain 28, the bit lines (BL) and the bit line contact plug (CB) are formed, which in the shallow trench isolation 26 is used to isolate two close DRAM cells.

In order to connect the deep trench capacitor 12 and the transistor, the buried strap out-diffusion area 30 referred to as node junction is formed on the top sidewall of the deep trench (DT). The node junction is formed by out-diffusing n-type ions in the second poly silicon layer 22 through the third poly silicon layer 24, which is called buried strap 24 into the close silicon substrate 10. The collar dielectric layer 20 effectively isolates the buried strap out diffusion area 30 and the buried strap 14 to avoid leakage and increase retention time, however, the upper width of the deep trench is enlarged during the conventional process step forming the collar dielectric layer 20, changing the distribution of the buried strap out diffusion region 30 and the overlap of the active area (AA) and the deep trench (DT). More particularly, the overlap (L) between source/drain region 28 and buried strap out diffusion region 30 is shortened, such that the leakage current through the buried strap out-diffusion region is enlarged and the sub-Vt is decreased.

FIG. 2A to FIG. 2E are cross section showing the process steps of forming the conventional collar dielectric layer. As shown in FIG. 2A, the p-type semiconductor substrate 10 with the deep trench capacitor comprises a silicon nitride pad layer 32, a deep trench (DT), an n-type diffusion area 14, a silicon nitride layer 16 and an n-type ions doped first poly silicon layer 18. As shown in FIG. 2B, after removing the silicon nitride layer over the deep trench (DT) and etching back the first silicon layer 18, the first silicon oxide layer 34 is formed on the exposed surface of the deep trench (DT) by the thermal process to cover the upper surface of the deep trench (DT), enhancing the isolation between the n-type diffusion region 14 and the buried strap out diffusion region 30. As shown in FIG. 2C, the second silicon oxide layer 36 is formed by chemical vapor deposition (CVD) and the portion over the first poly silicon layer 18 is then removed by anisotropic etching.

As shown in FIG. 2D, the n-type ion doped second poly silicon layer 22 is deposited in the deep trench (DT) and then etched to a target depth. As shown in FIG. 2E, a portion of the first silicon oxide layer 34 and the second silicon oxide layer 36 is removed by wet etching, exposing the raised top of the second poly silicon layer 22. The recessed first silicon oxide layer 34 and the second silicon oxide layer 36 are used as the collar dielectric layer 26 of the trench capacitor, however, a portion of the silicon substrate 10 is oxidized during the process step of forming the first silicon oxide layer 34, such that the upper width of the deep trench (DT) is enlarged during the subsequent wet etching, reducing the overlap (L) between the source/drain region 28 and the buried strap out diffusion region 30 as well as the leakage increases and sub-Vt gets lower.

The first silicon oxide layer 34 is necessary for the deep trench (DT) even though top width of the deep trench (DT) is enlarged. If the first silicon oxide layer 34 is skipped or its thickness reduced, leakage through the contact between the n-type diffusion region 14 and the buried strap out-diffusion region 30 becomes bigger. Accordingly, how to improve the collar oxide process to avoid the enlarging of the upper width of the deep trench is important.

SUMMARY OF THE INVENTION

An object of the present invention is to provide a method for controlling the top width of the trench, in which a sacrificial layer on the deep trench sidewall at the buried strap out diffusion region is formed to avoid enlarging of the upper width of the deep trench during the following process.

Additional objects and advantages of the invention will be set forth in part in the description which follows, and in part will be obvious from the description which follows, and in part will be obvious from the description, or may be learned by practice of the invention. The objects and advantages of the invention will be realized and attained by means of the elements and combinations particularly pointed out in the appended claims.

To achieve the objects in accordance with the purpose of the invention, as embodied and broadly described herein, the invention comprises the following steps. A substrate with a trench is provided with the conductive layer formed in a portion thereof. A sacrificial layer is formed in another portion of the trench thereon. The interval layer is removed to expose the sidewall of the trench over the conductive layer, such that the sacrificial layer and the exposed sidewall of the trench are oxidized.

Another method for controlling the top width of a trench comprises the following steps. A substrate with a trench is provided and the conductive layer is formed in a portion. A shield layer is formed in another portion of the trench. The interval layer is removed to expose the sidewall of the trench over the conductive layer, and the exposed sidewall of the trench is oxidized with the shield layer as a mask.

It is to be understood that both the foregoing general description and the following detailed description are exemplary and explanatory only and are not restrictive of the invention, as claimed.

BRIEF DESCRIPTION OF THE DRAWINGS

The accompanying drawings, which are incorporated in and constitute apart of this specification, illustrate embodiments of the invention and together with the description, serve to explain the principles of the invention.

In the figures.

DETAILED DESCRIPTION OF THE INVENTION

Aspects of present invention are now described in further detail with reference to FIGS. 3A–3E.

Figure 1A:
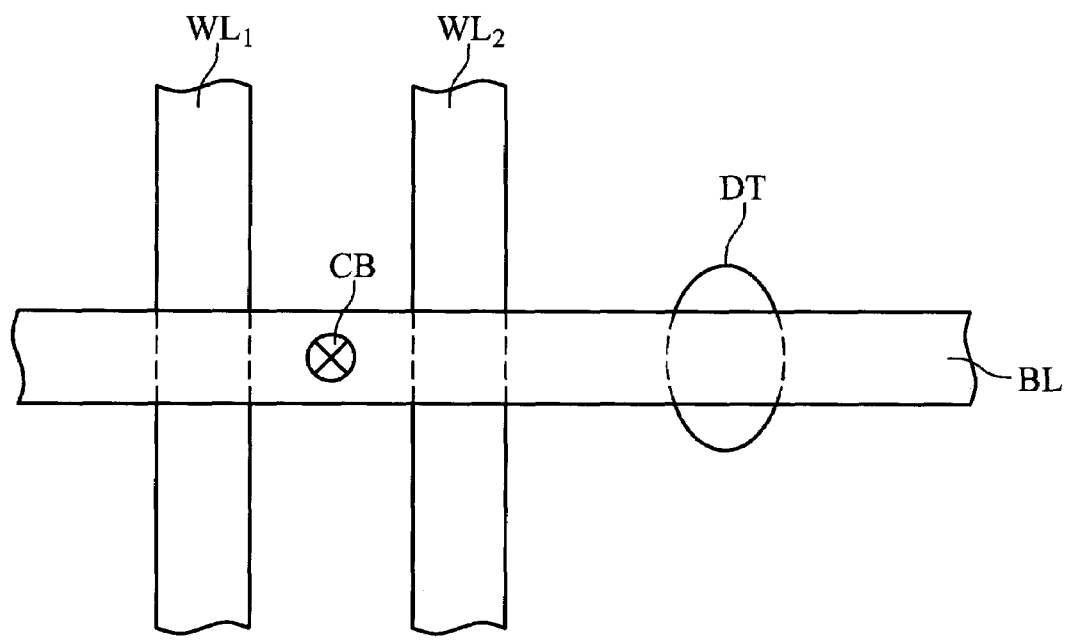
FIG. 1A is a plane view of a conventional deep trench DRAM cell.
Figure 1B:
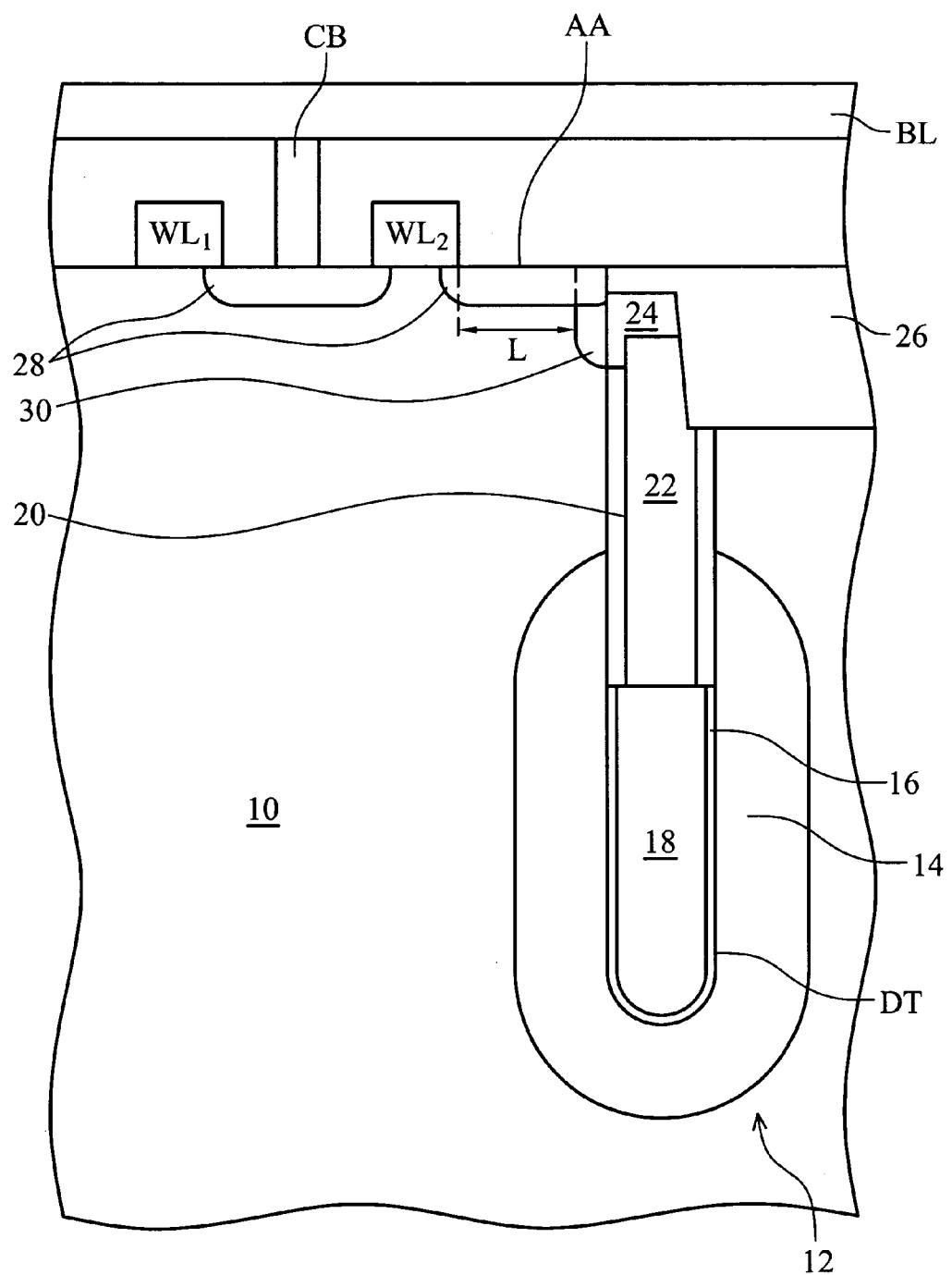
FIG. 1B is a section view of a conventional deep trench DRAM cell.
Figure 2A:
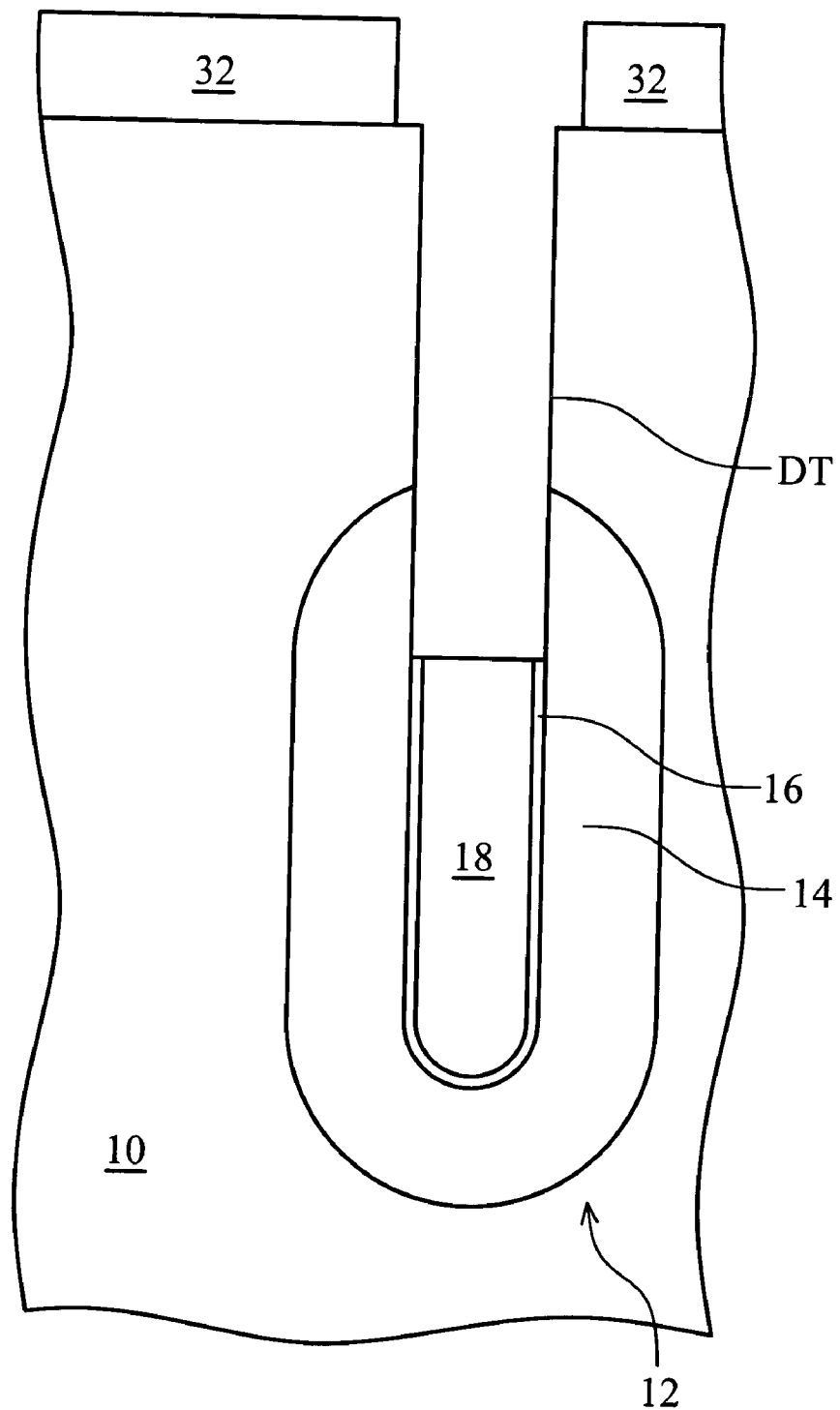
FIGS. 2A–2E schematically illustrate process steps in the conventional formation of a trench structure.
Figure 2B:
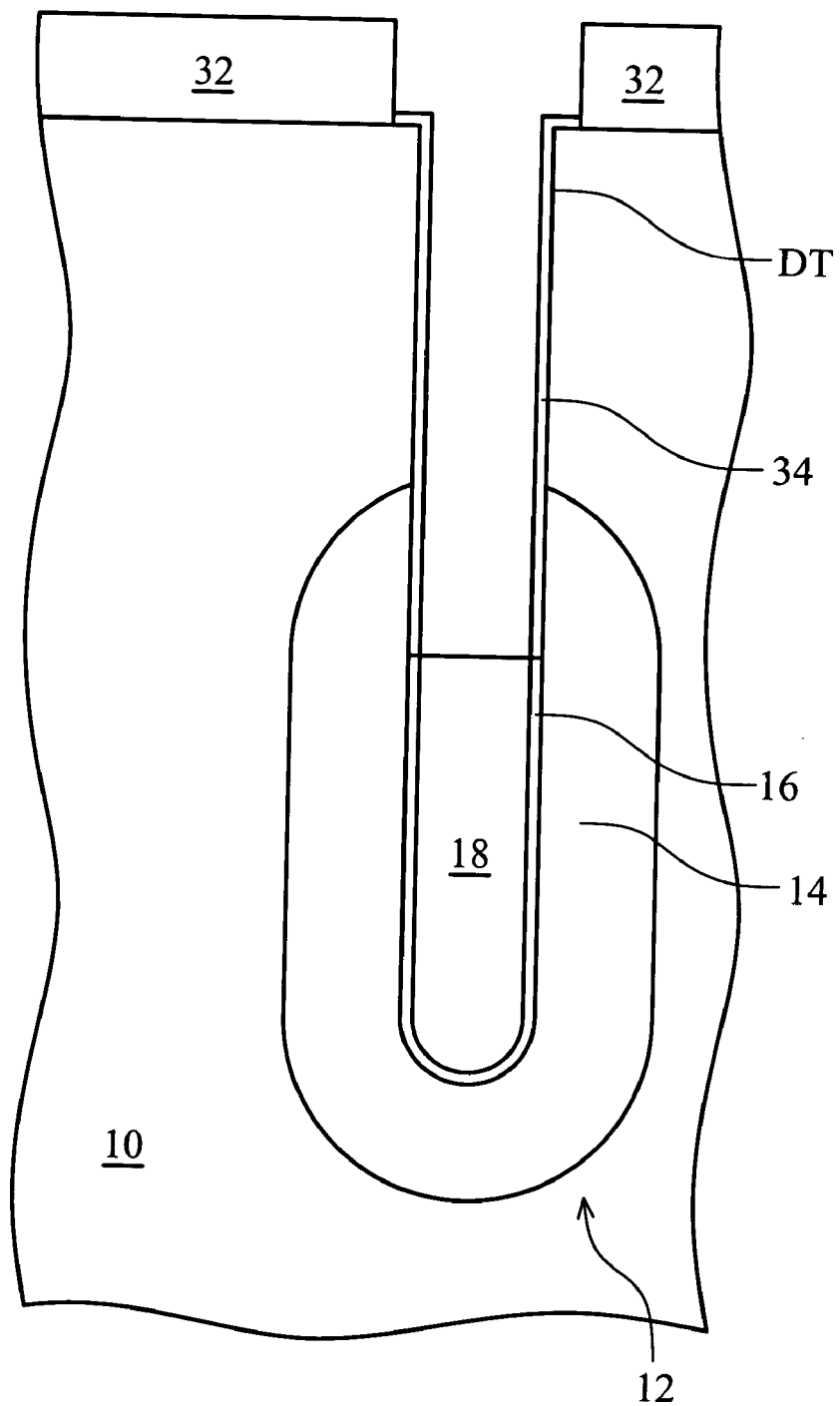
Figure 2C:
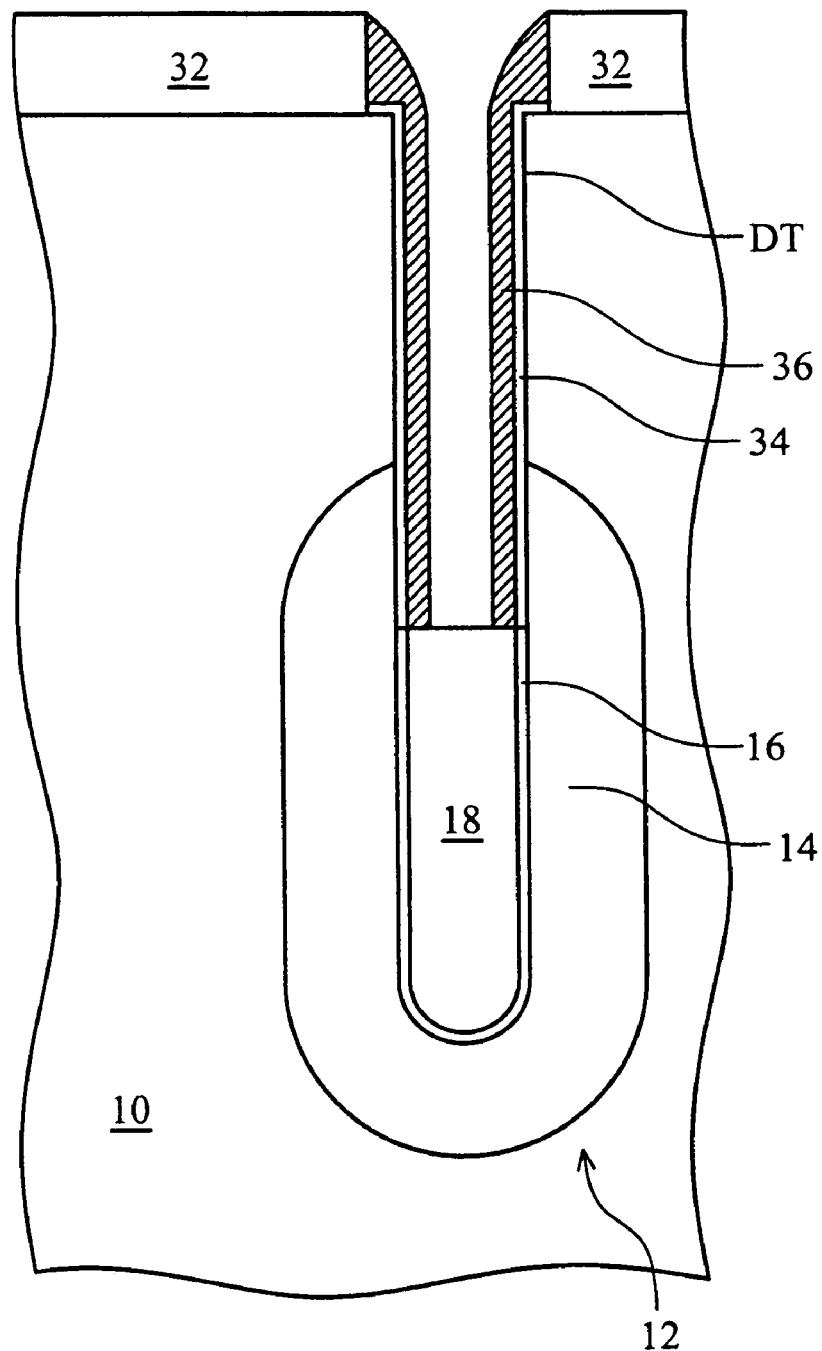
Figure 2D:
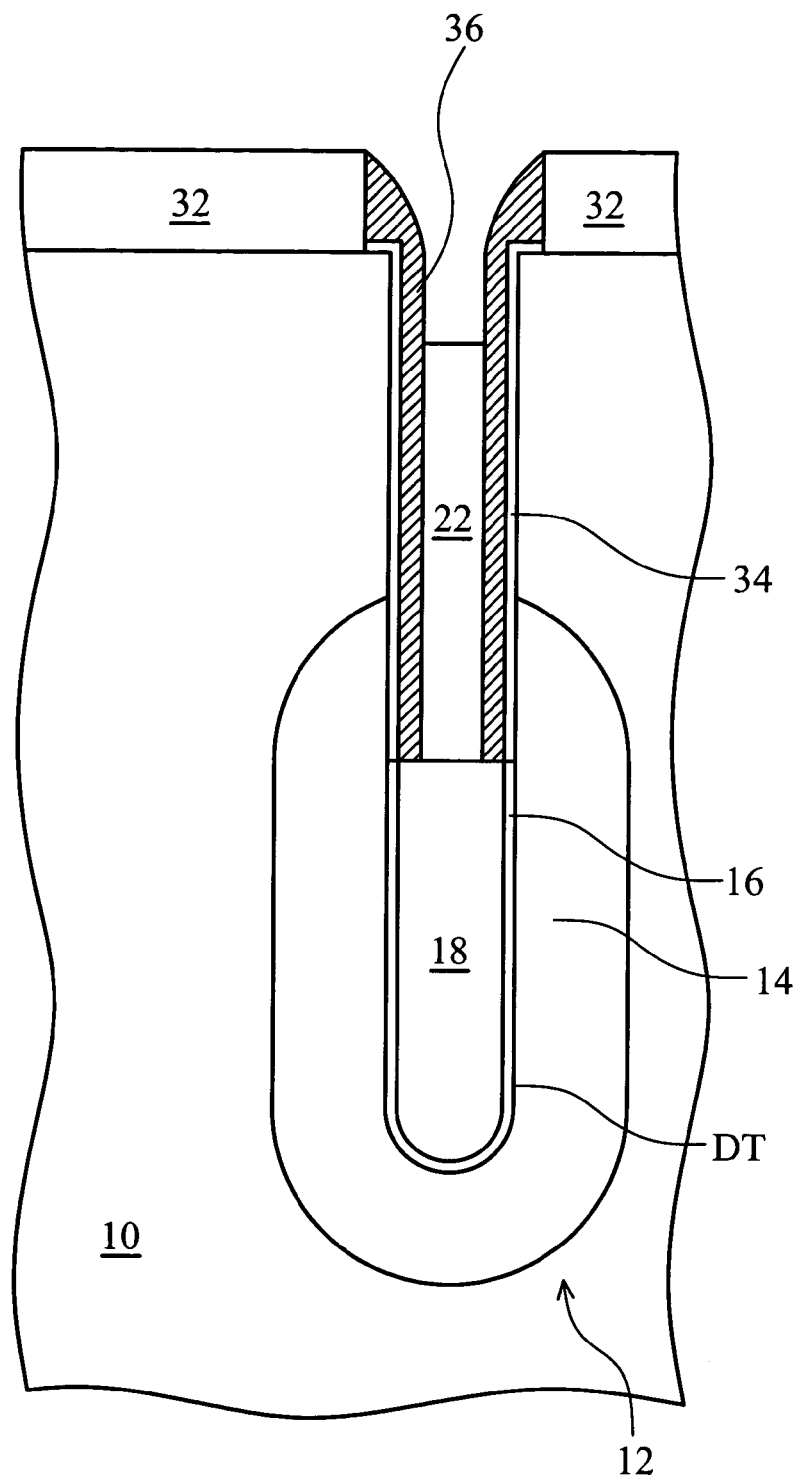
Figure 2E:
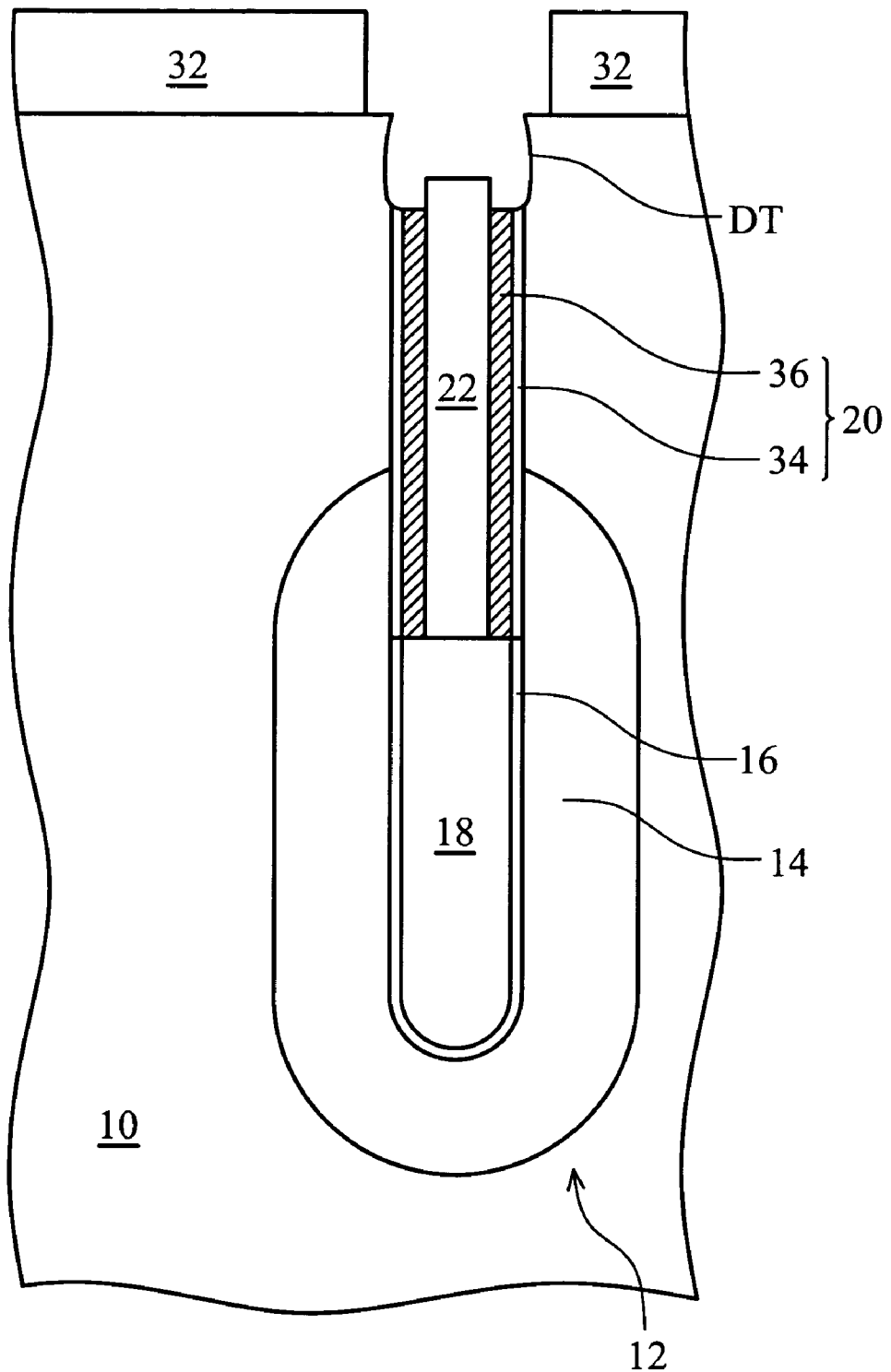
Figure 3A:
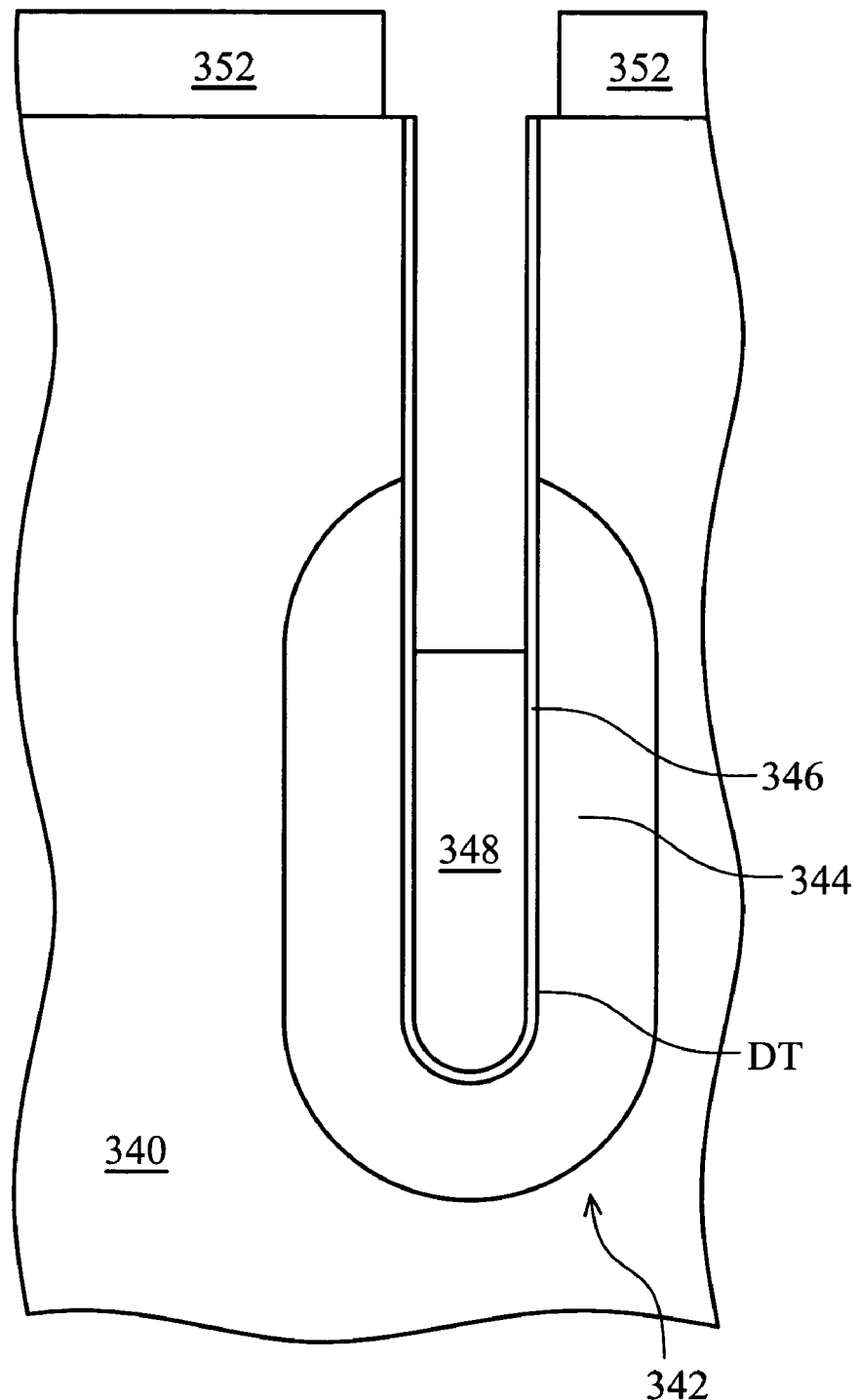
FIGS. 3A–3J schematically illustrate process steps in the formation of a trench structure in accordance with the first embodiment of the present invention.

As shown in FIG. 3A, a semiconductor substrate 340 with a deep trench capacitor 342 is provided, which in the semiconductor substrate 340 may be a single crystal silicon substrate. The deep trench capacitor 342 comprises a buried plate 344, a storage dielectric layer 346 and a storage node 348, in which the buried plate 344 is used as a bottom electrode and the storage node 348 is used as the top electrode. The process steps of deep trench capacitor 342 follow. The deep trench (DT) is formed in the p-type silicon substrate 340 by reactive ion etching (RIE) with the pad layer 352 as the mask. Preferably, the depth of the trench is 5000 nm~9000 nm and the pad layer 352 is formed of the silicon nitride.

The n-type ions in heavily doped oxide (e.q., ASG) are diffused into the bottom of the deep trench (DT) by rapid thermal process to form a n-type diffusion region 344 used as the buried plate of the trench capacitor. The silicon nitride layer 346 is formed on the sidewall and bottom of the deep trench (DT), followed by the deposition of the n-type ion doped conductive layer 348 in the trench (DT), in which the conducive layer may be polysilicon. The conductive layer 348 is etched back to approximately 600 nm~1400 nm below the surface of the substrate. Consequently, the recessed conductive layer 348 is used as the top electrode and the silicon nitride layer 346 between the n-type diffusion region 344 and the conductive layer 348 as the storage dielectric layer of the trench capacitor.

Figure 3B:
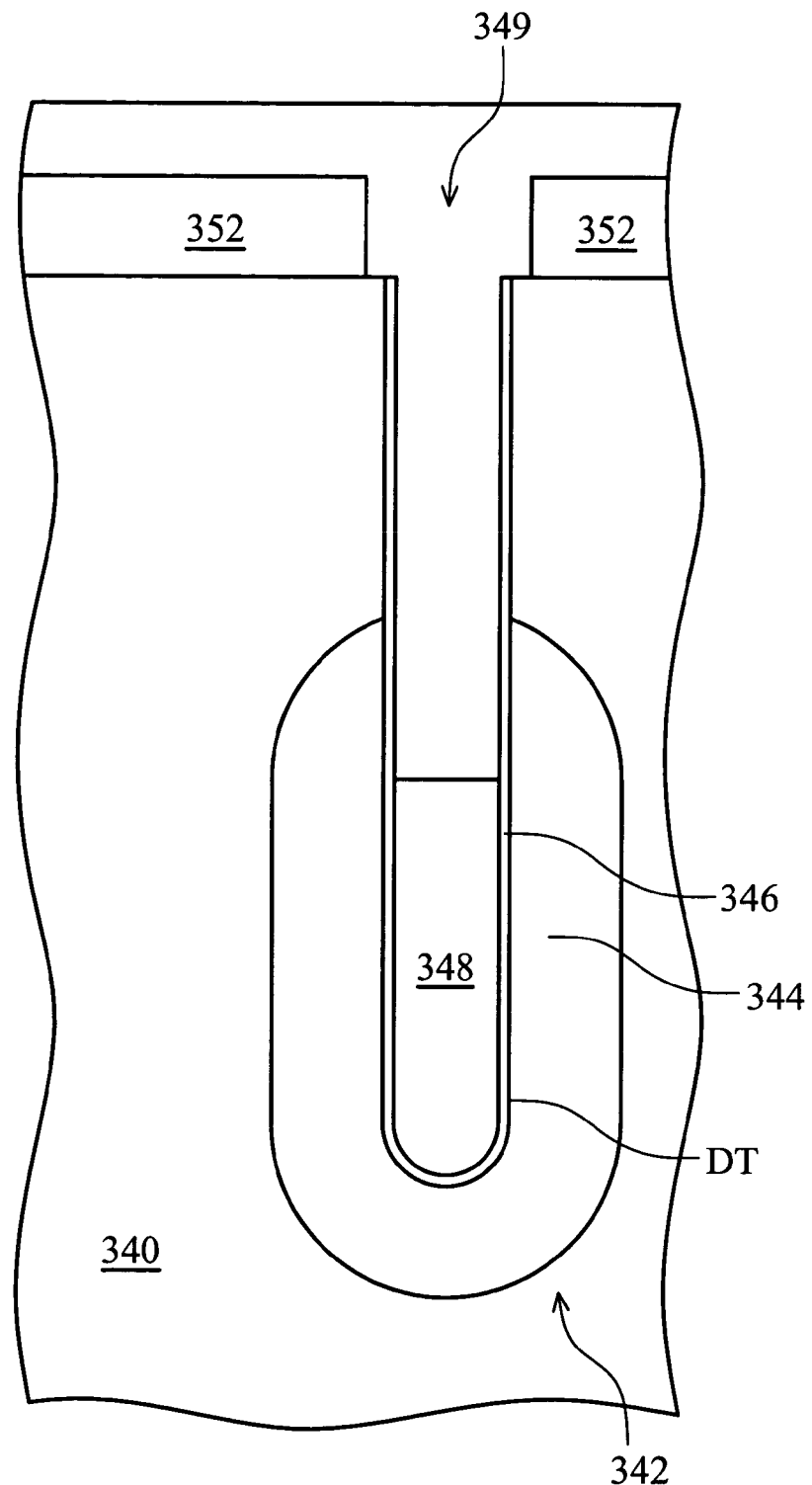
Figure 3C:
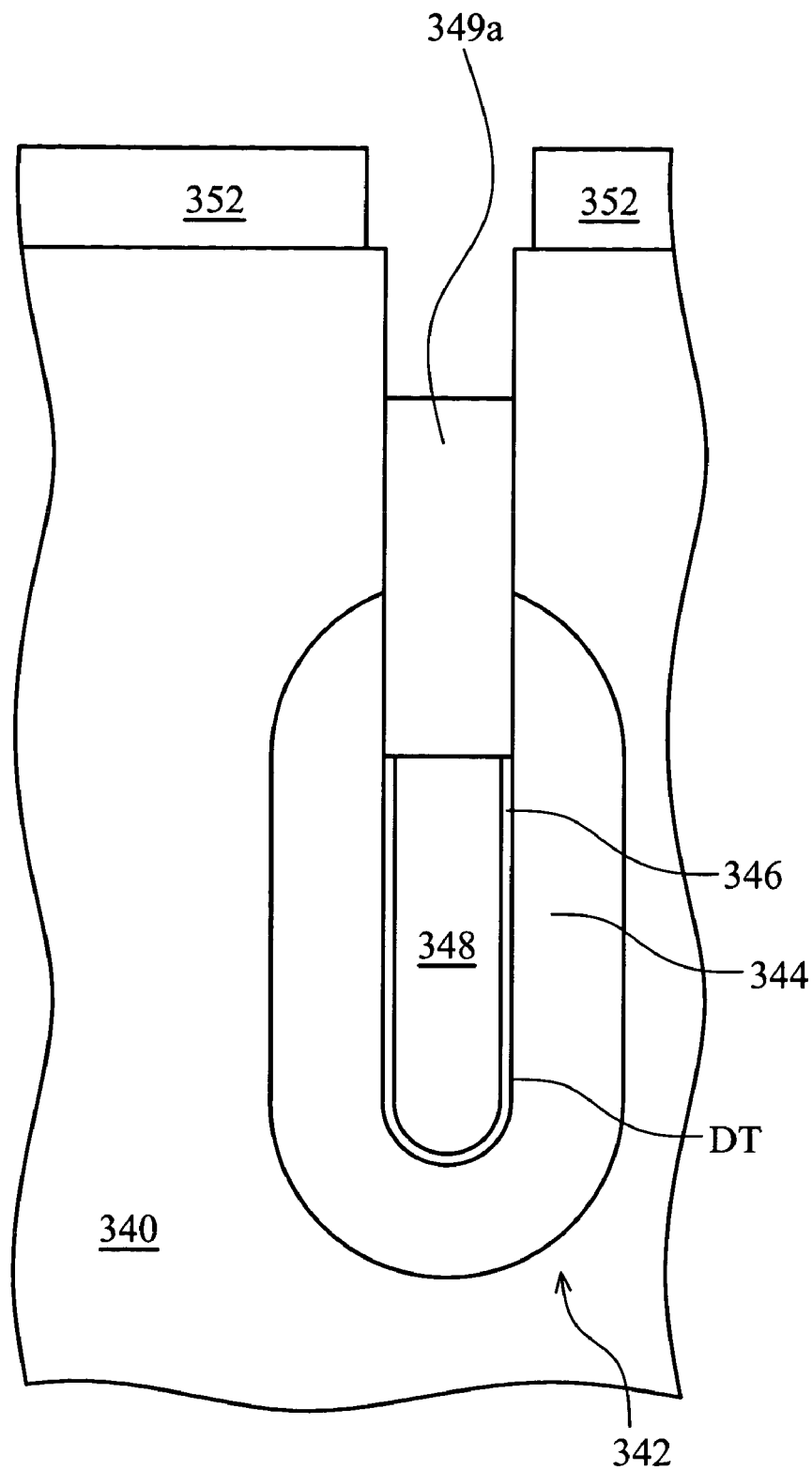
Figure 3D:
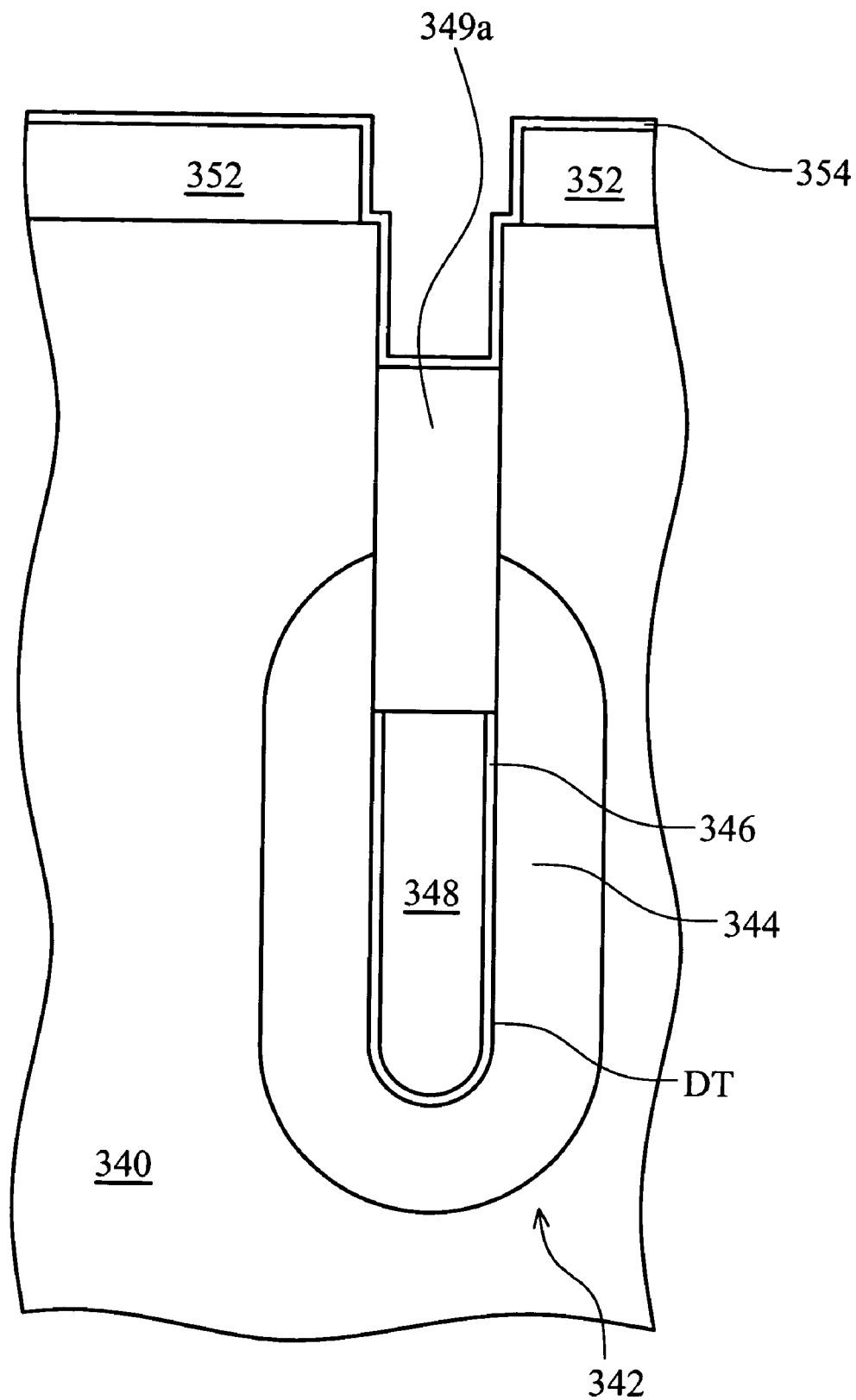
Figure 3E:
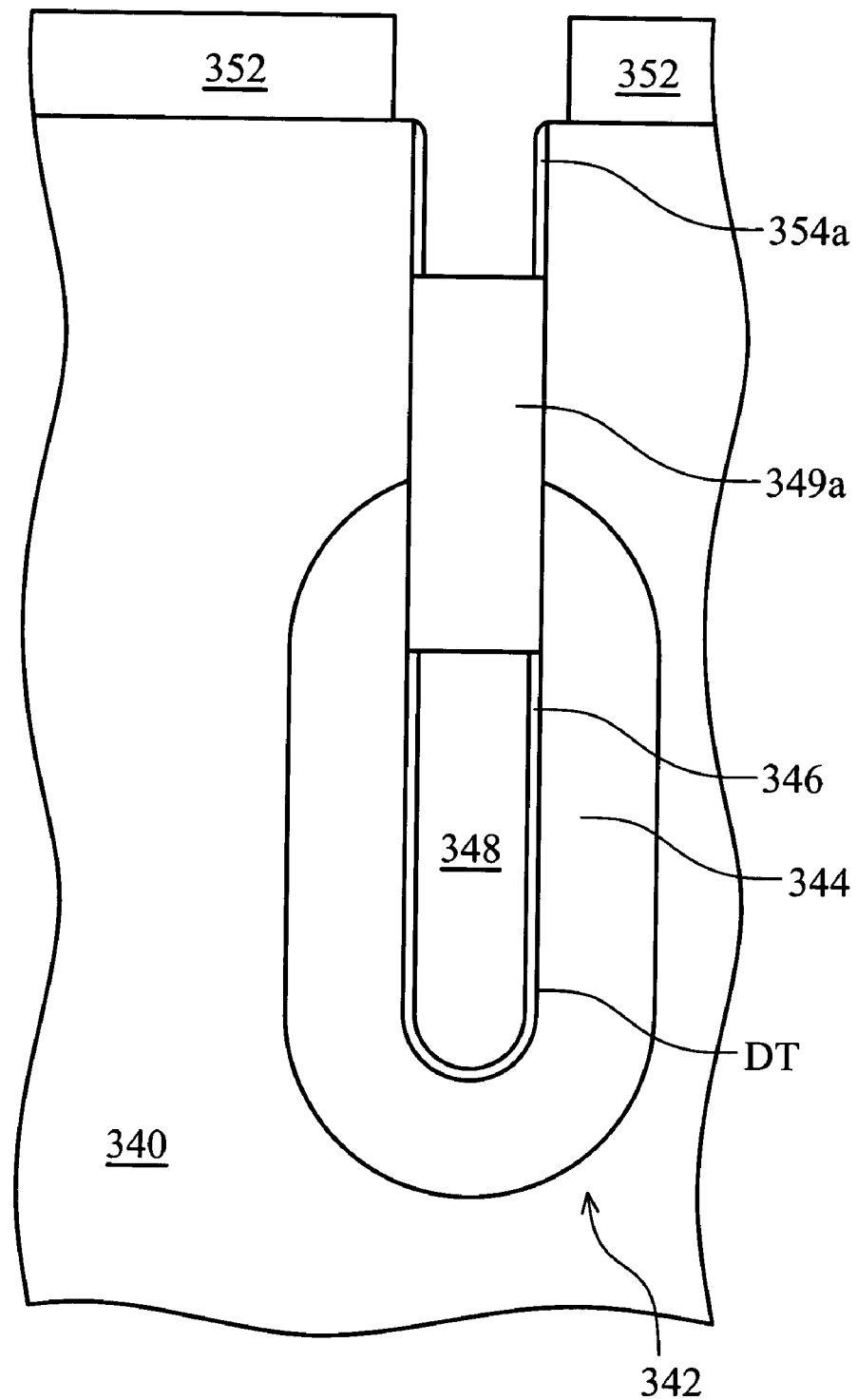

As shown in FIG. 3B, the node dielectric layer 346 over the conductive layer 348 is removed, followed by blanket deposition of the interval layer 349 in the trench and on the substrate, which in the interval layer 349 is preferably composed of TEOS. Referring to FIG. 3C, the interval layer 349 on the substrate and a portion of the interval layer 349 in the trench are removed by etching, in which the recessed top of the remaining interval layer 349a is preferably 1200 nm~1800 nm below the surface of the trench. As shown in FIG. 3D, a sacrificial layer 354 is conformally deposited, preferably is deposited by CVD to form an amorphous silicon with approximate thickness 20 nm~70 nm. As shown in FIG. 3E, the sacrificial layer 354 is etched by anisotropic etching, for example, a reactive ion etching or a dry etching with CI as the main etchant. Thereafter, the sacrificial layer 354, over the interval layer 349a and the substrate, is etched, such that only the sacrificial layer 354 on sidewalls of the trench over the interval layer 349a remains.

Figure 3F:
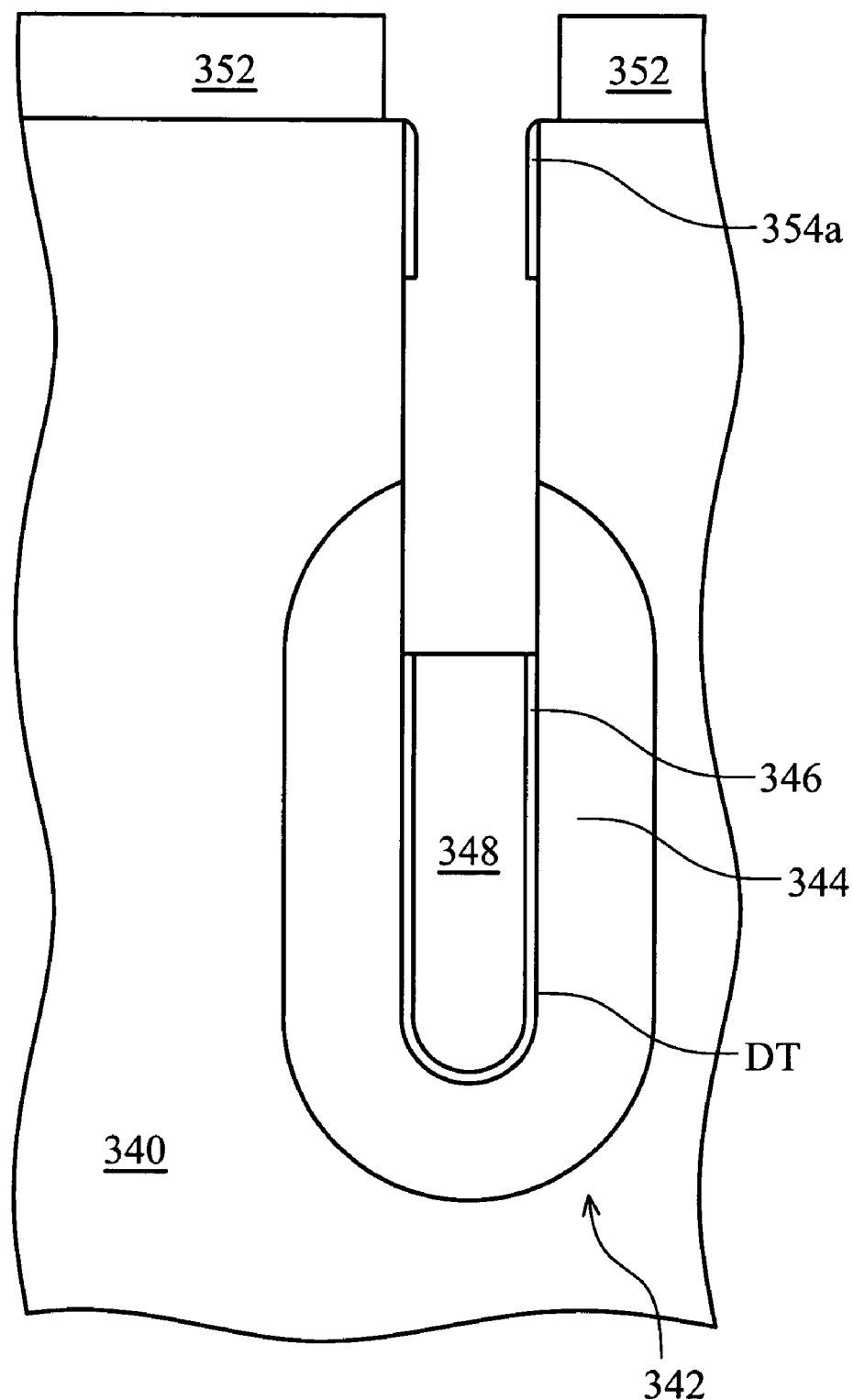
Figure 3G:
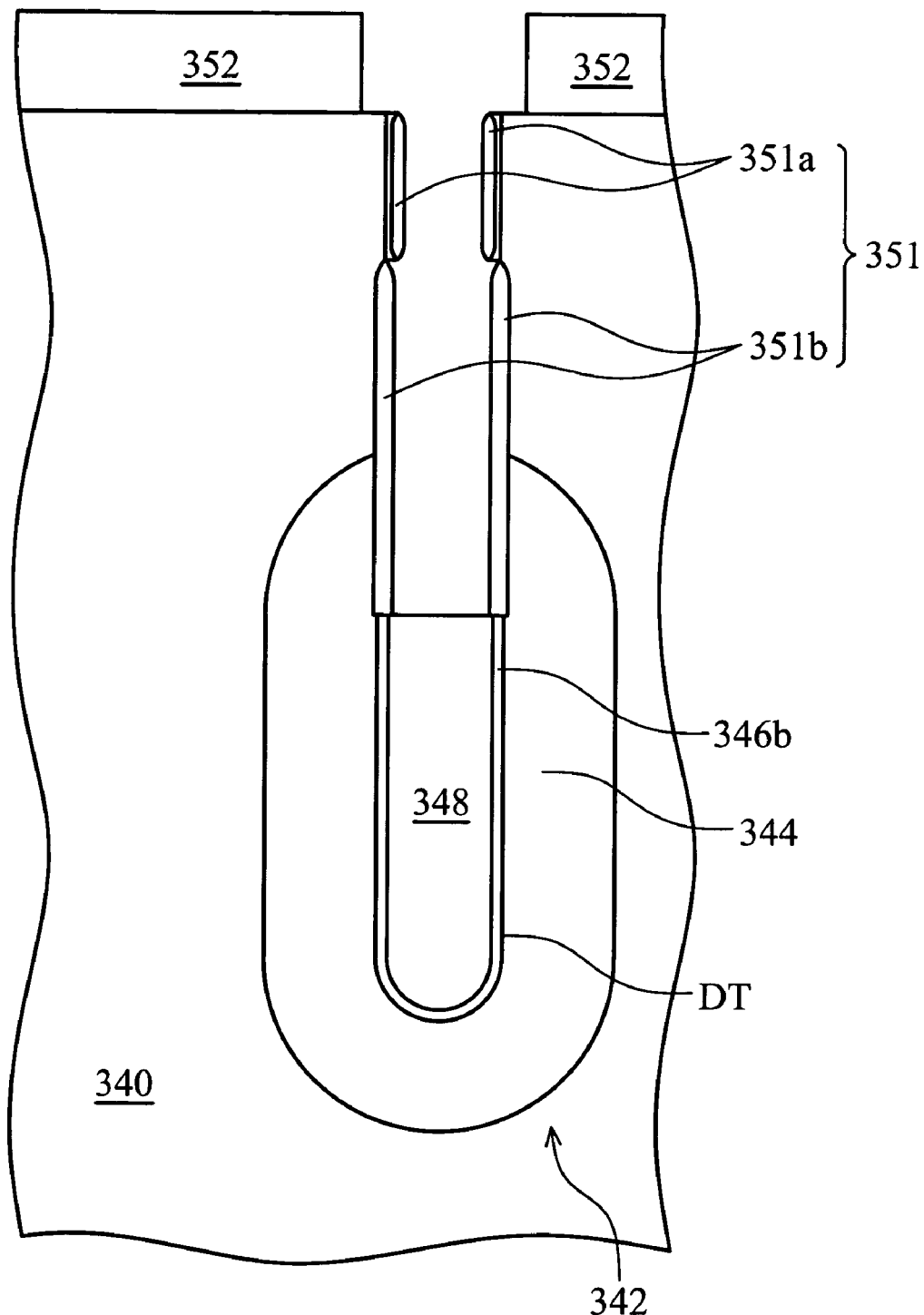

As shown in FIG. 3F, the interval layer 349a is removed by etching, for example, wet etching using HF as the main etchant. After removing interval layer 349a, the sidewall over the conductive layer in the trench is exposed. As shown in FIG. 3G, a first silicon oxide layer 351 is formed on the exposed sidewall of the trench (DT) by the thermal process to protect the upper sidewall of the trench, enhancing the isolation between the n-type diffusion region 344 and the buried out diffusion region 362. More particularly, because the first silicon oxide layer 351a is formed on the sacrificial layer and the exposed sidewall of the trench, the top width of the deep trench is not enlarged during subsequent etching process.

Figure 3H:
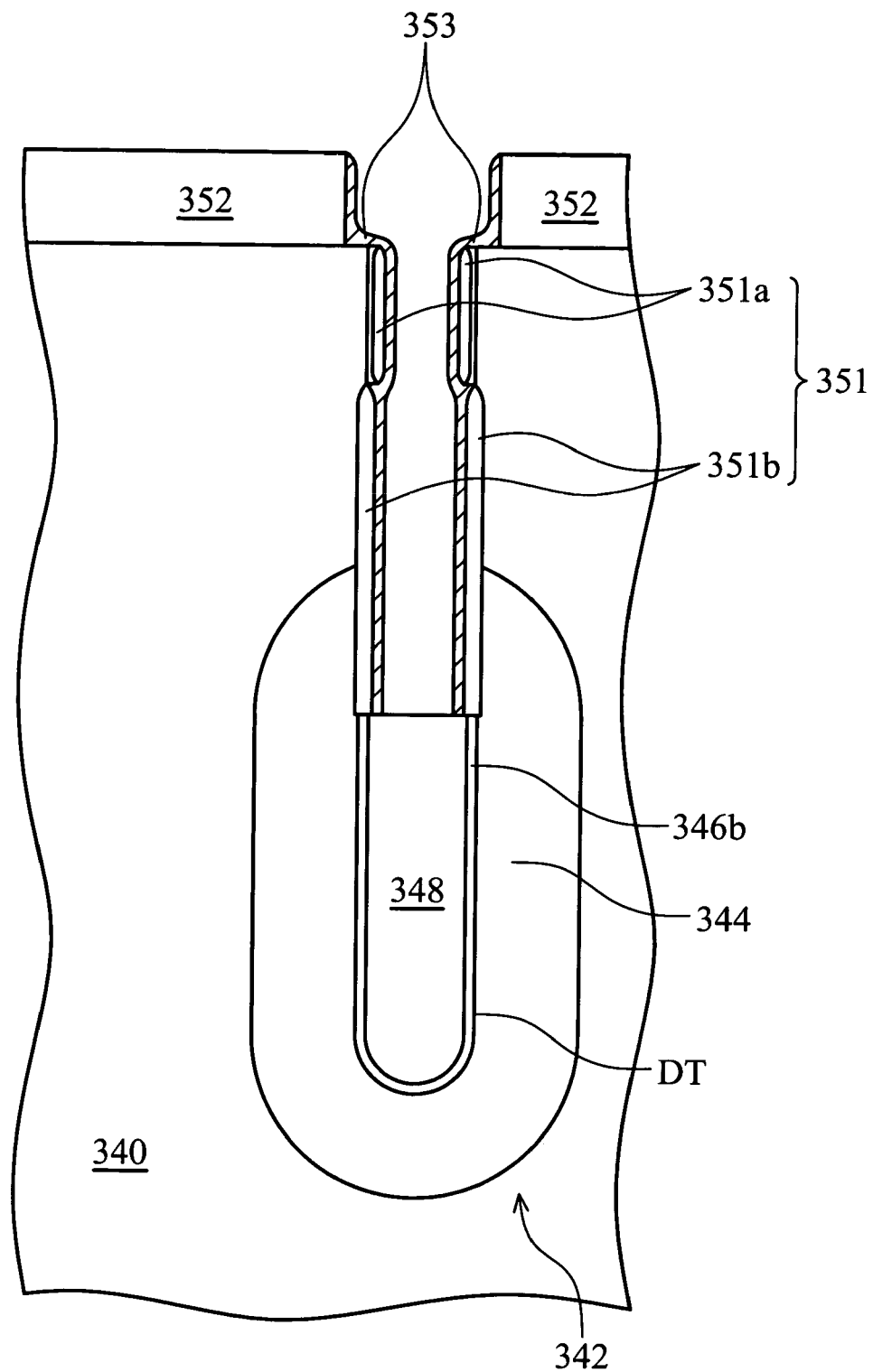
Figure 3I:
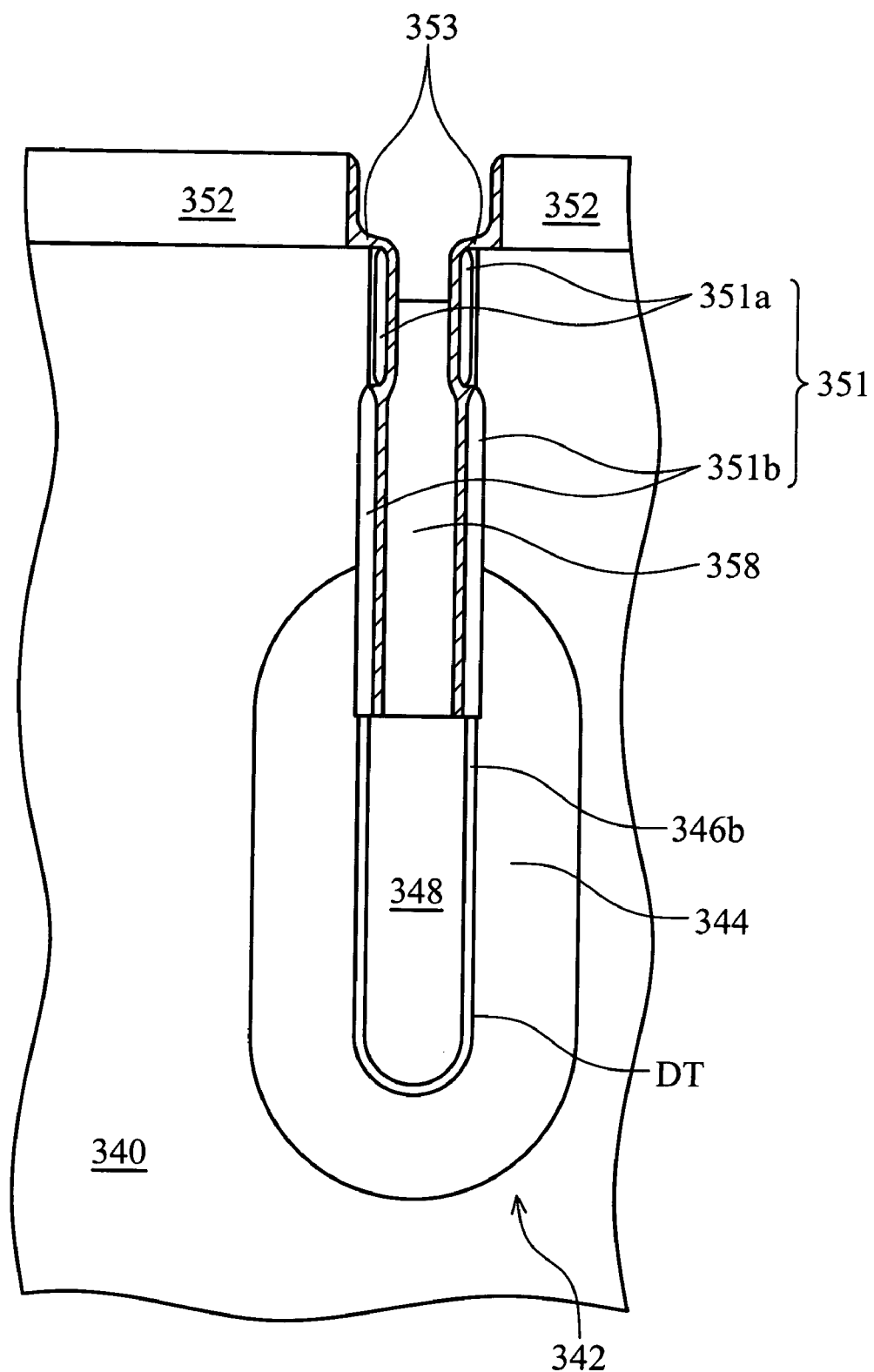

As shown in FIG. 3H, a second silicon oxide layer 353 is deposited in the trench by CVD, followed by anisotropic etching to remove the second silicon oxide layer 353 over the conductive layer 348. As shown in FIG. 3I, an n-type upper conductive layer 354a is deposited in the trench and then etched back to a target depth below the surface of the substrate.

Figure 3J:
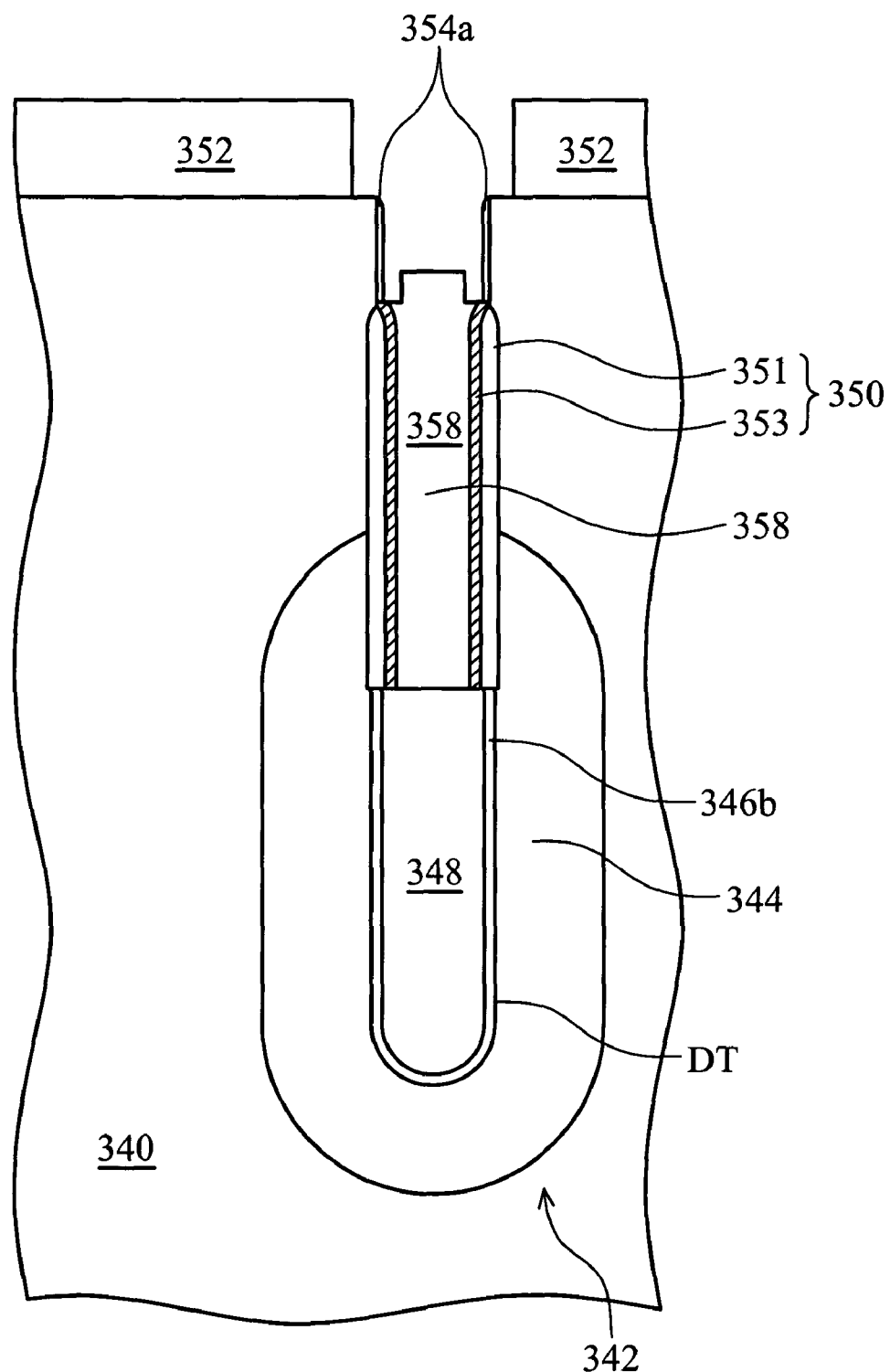

As shown in FIG. 3J, a portion of the first silicon oxide layer 351 and the second silicon oxide layer 353 over the sacrificial layer 358 are removed by wet etching to expose the raised top of the upper conductive layer. Both the first silicon oxide layer 351 and the second silicon oxide layer 353 are etched to the level of the top, such that the recessed first silicon oxide layer and the second silicon oxide layer on the upper sidewall of the trench are used as the collar dielectric layer 350 of the trench capacitor.

Figure 3K:
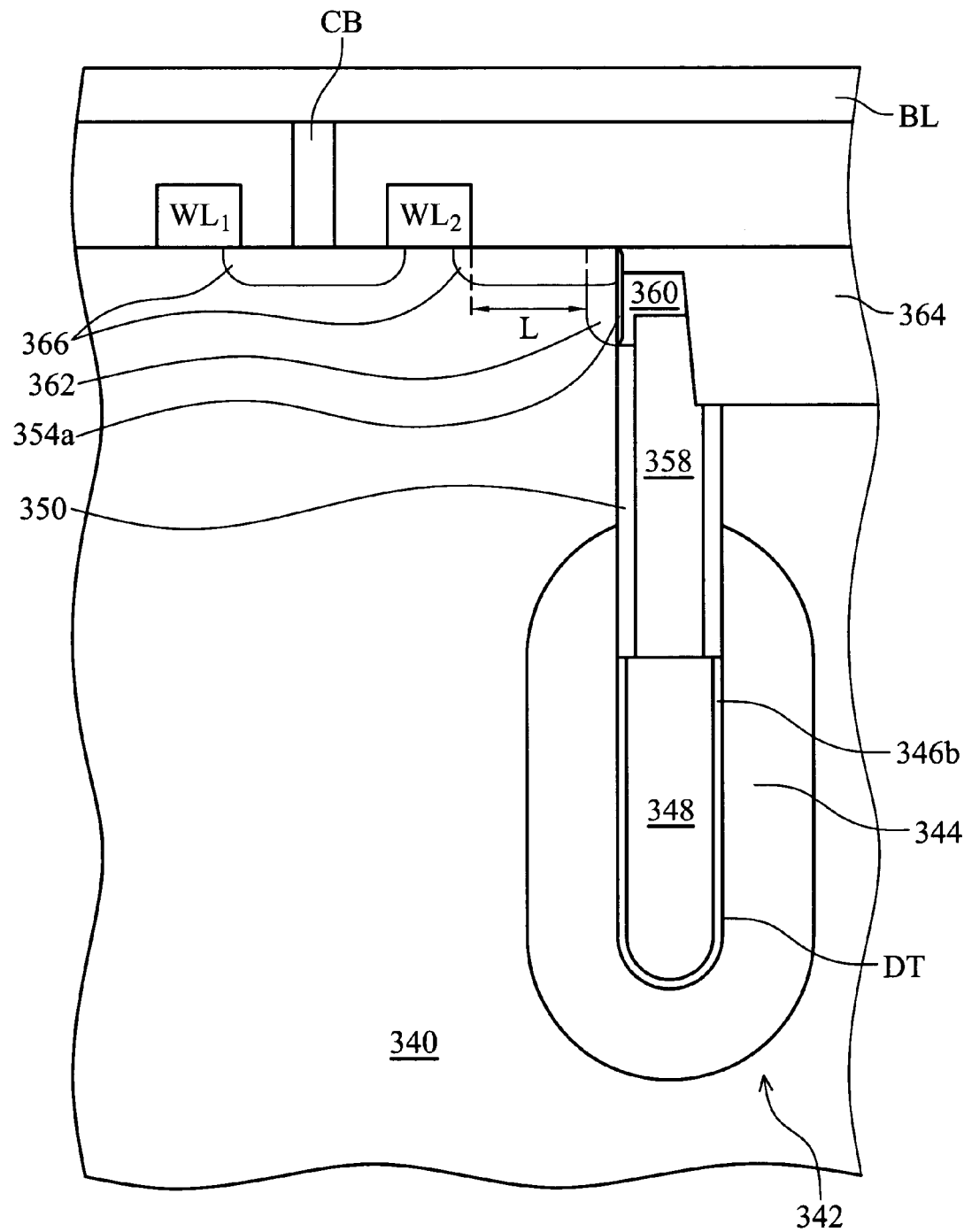
FIG. 3K is a section view of a deep trench DRAM cell structure in accordance with the present invention.

FIG. 3K is a cross-section showing the collar oxide process steps of the DRAM cell in accordance with the present invention. Formation of the collar dielectric layer 350 is followed by the formation of the top conductive layer 360 (buried region), the buried out-diffusion region 362, the shallow trench isolation 364, word lines (WL1 and WL2), the source/drain 366, the bit line (BL), and the bit line contact plug (CB). Because these parts are not the points of the present invention, the description is not illustrated herein.

FIG. 4A~4G are sectional views showing the second embodiment in accordance with the present invention.

Figure 4A:
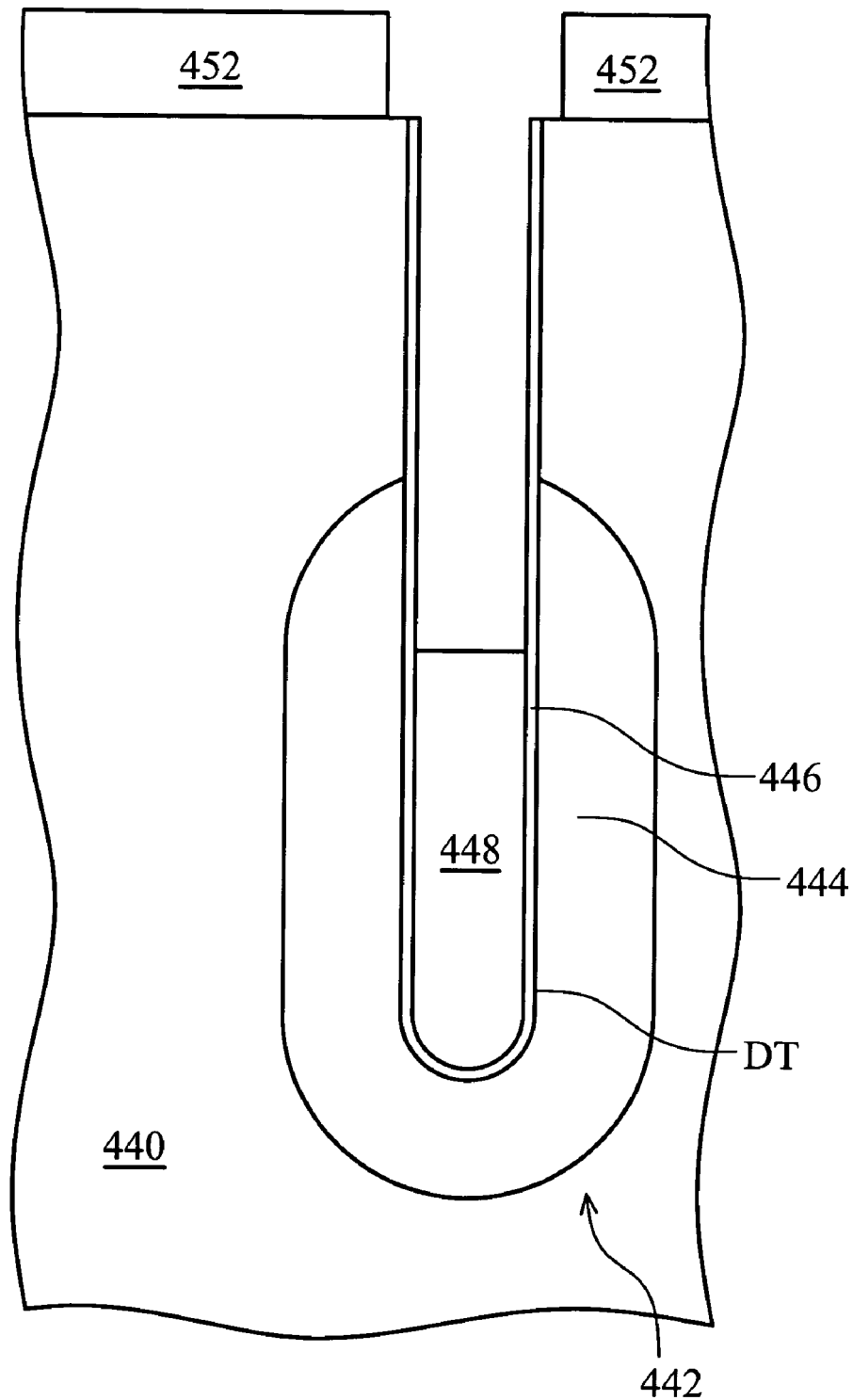
FIGS. 4A–4G schematically illustrate process steps in the formation of a trench structure in accordance with the second embodiment of the present invention.

As shown in FIG. 4A, a semiconductor substrate 440 with a deep trench capacitor 442 is provided, which in the semiconductor substrate 440 may be a single crystal silicon substrate. The deep trench capacitor comprises a buried plate 444, a storage dielectric layer 446 and a storage node 448, in which the buried plate 448 is used as the bottom electrode and the storage node 448 is used as the top electrode. The process steps of deep trench capacitor 442 follow. The deep trench is formed in the p-type silicon substrate 440 by reactive ion etching (RIE) with the pad layer 452 as the mask. Preferably, the depth of the trench is 5000 nm~9000 nm and the pad layer 452 is formed of silicon nitride.

The n-type ions in heavily doped oxide (e.q., ASG) are diffused into the bottom of the deep trench (DT) by rapid thermal process to form a n-type diffusion region 444 used as the buried plate of the trench capacitor. The silicon nitride layer 446 is formed on the sidewall and bottom of the deep trench, followed by the deposition of the n-type ions doped conductive layer 448 in the trench, in which the conducive layer may be formed of polysilicon. The conductive layer 448 is etched back to approximately 600 nm~1400 nm below the surface of the substrate. Consequently, recessed conductive layer 448 is used as the top electrode and the silicon nitride layer 446 between the n-type diffusion region 444 and the conductive layer 448 is used as the storage dielectric layer of the trench capacitor.

Figure 4B:
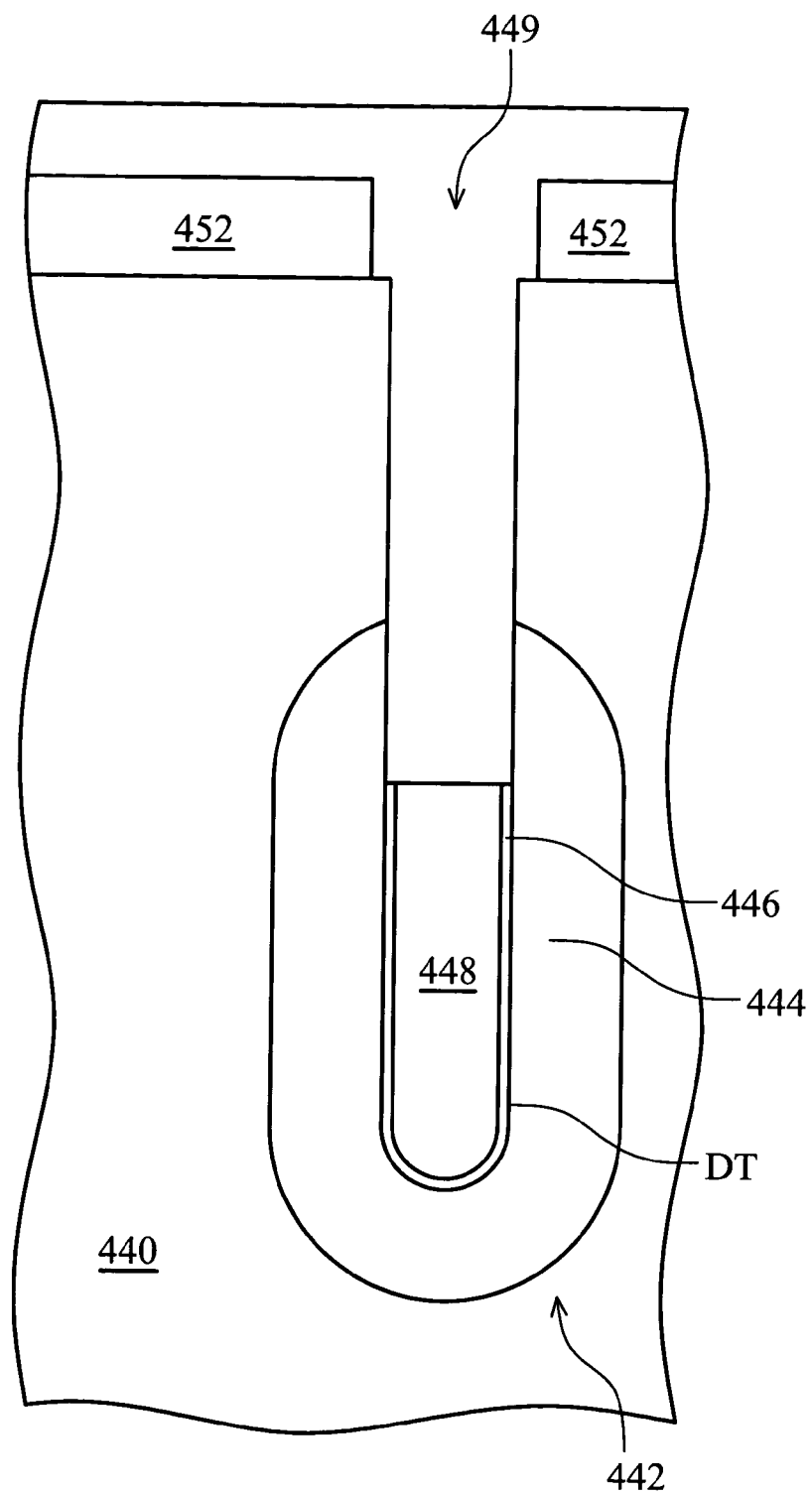
Figure 4C:
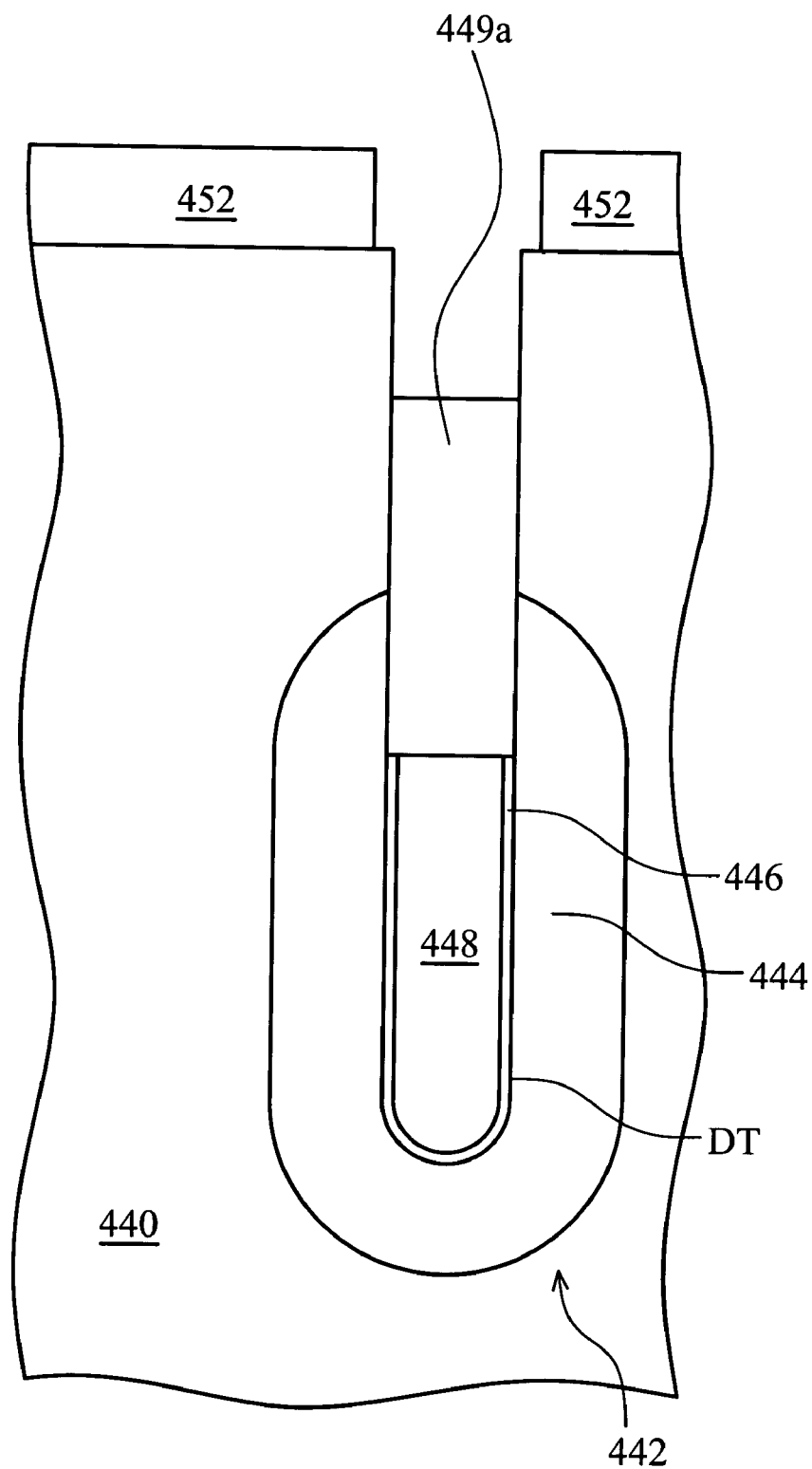

As shown in FIG. 4B, the node dielectric layer over the conductive layer is removed, followed by blanket deposition of the interval layer 449 in trench and on the substrate, in which the interval layer is preferably composed of TEOS. Referring to FIG. 4C, the interval layer 449 on the substrate and a portion of the interval layer 449 in the trench are removed by etching, in which the recessed top of the remaining interval layer 449a is preferably 1200 nm~1800 nm below the surface of the trench.

Figure 4D:
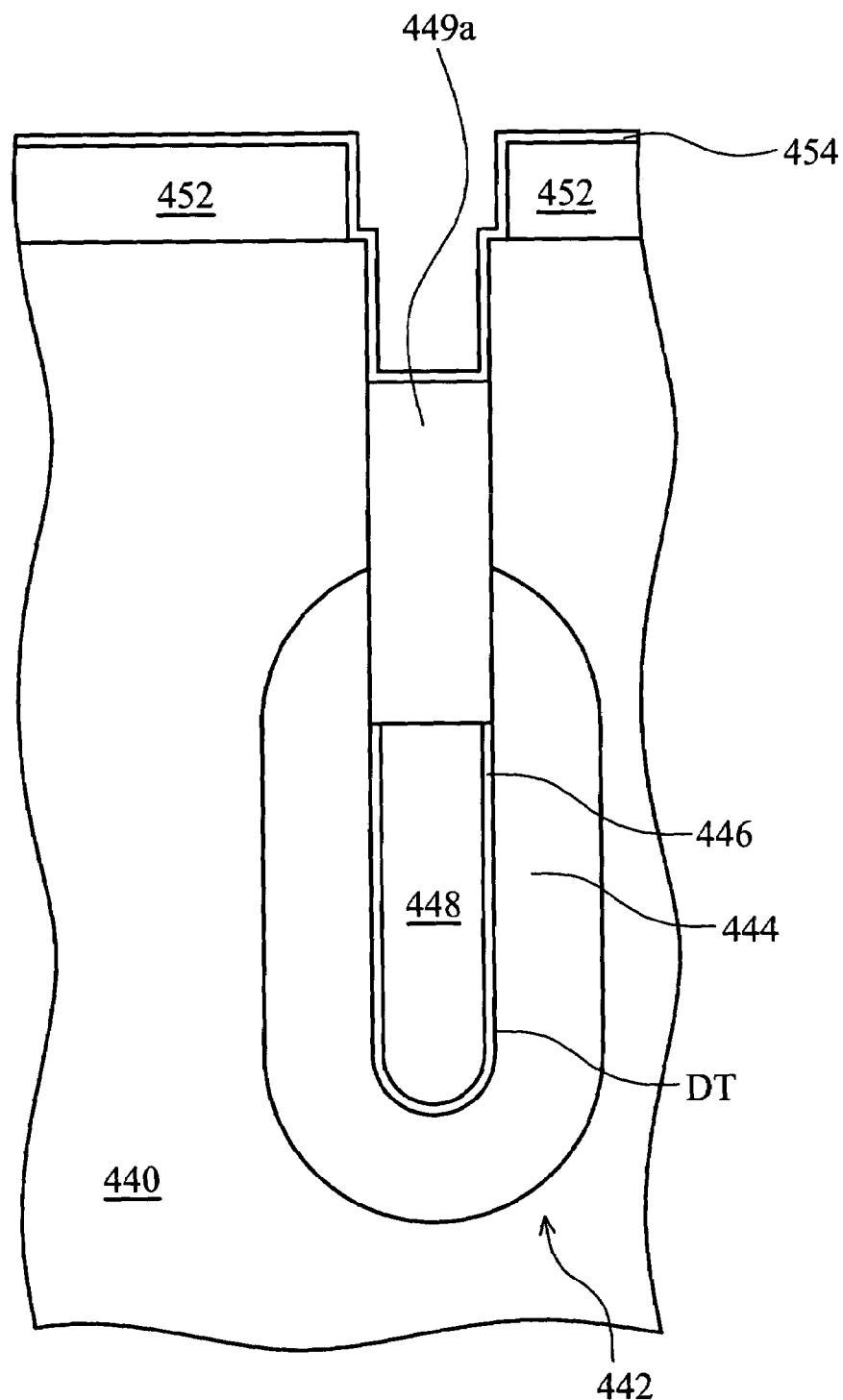
Figure 4E:
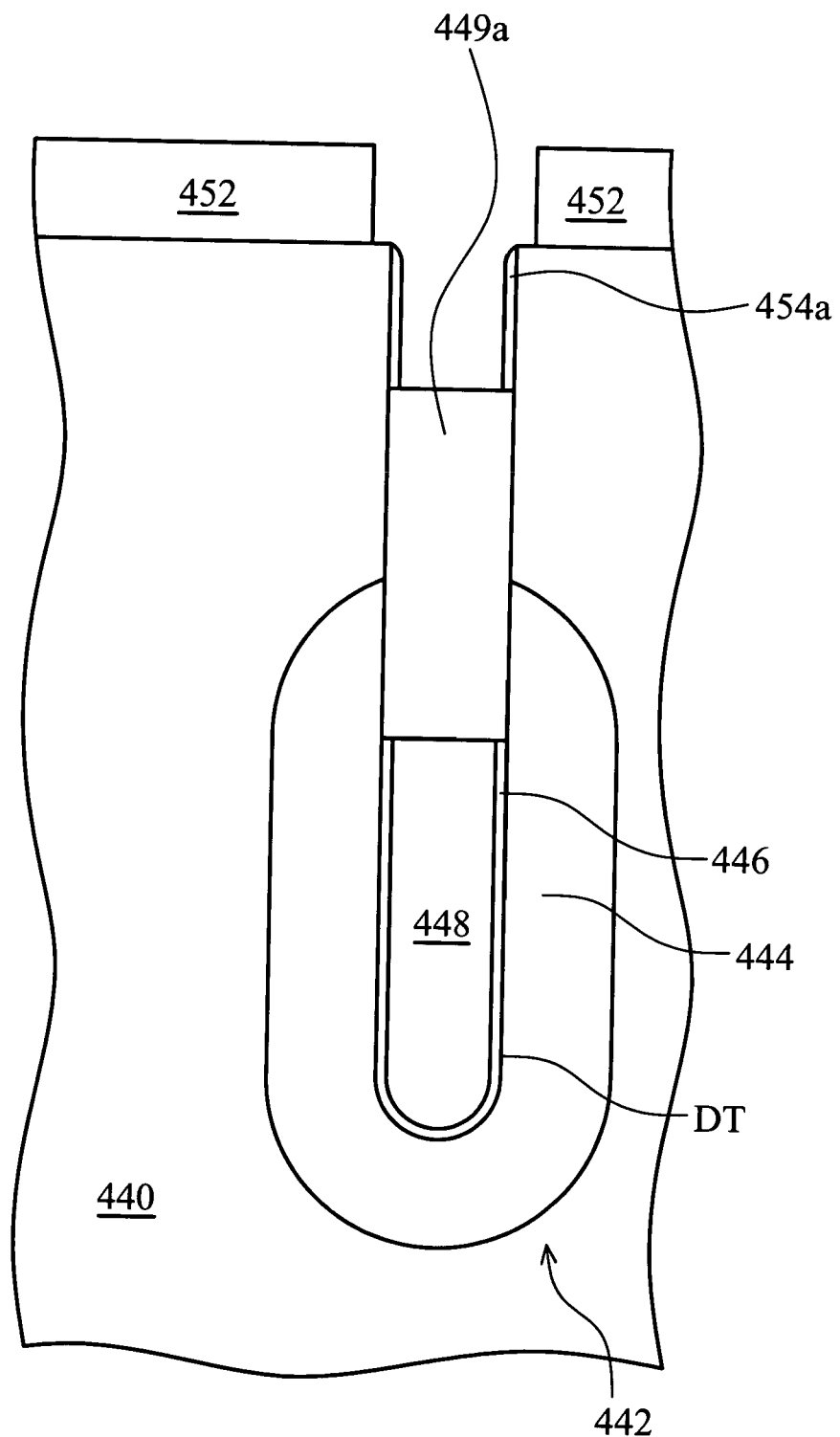

As shown in FIG. 4D, a shield layer 454 is conformally deposited, preferably by CVD to form a silicon nitride layer with approximate thickness 20 nm~70 nm. As shown in FIG. 4E, the shield layer 454a is etched by anisotropic etching, for example, a reactive ion etching or a dry etching with Cl as the main etchant. Thereafter, the shield layer 454a over the interval layer and the substrate is etched to form the shield layer on the sidewall of the trench over the interval layer.

Figure 4F:
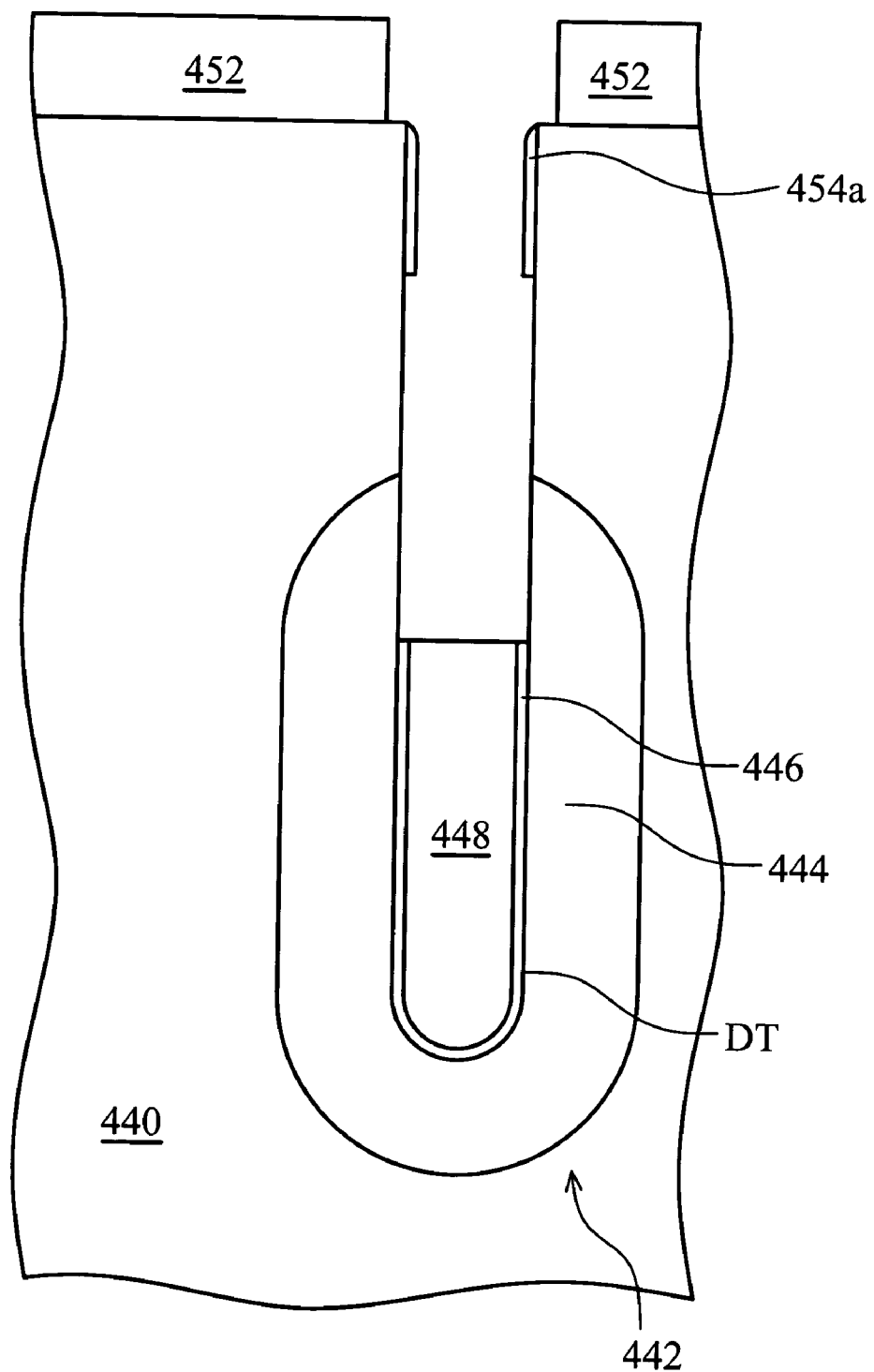
Figure 4G:
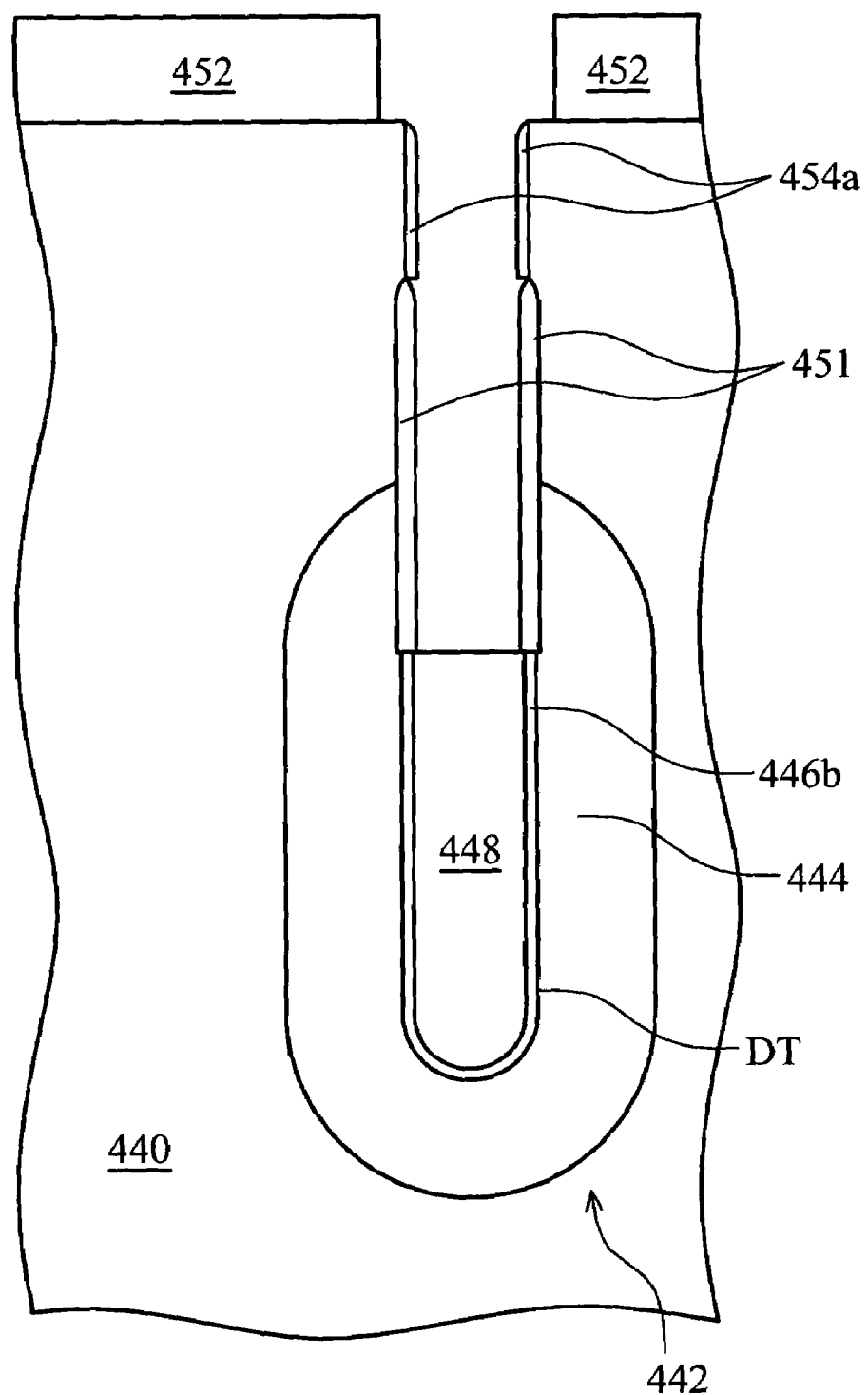

As shown in FIG. 4F, the interval layer 449a is removed by etching, such as wet etching using HF as the main etchant. After removing interval layer 449a, the sidewall over the conductive layer in the trench is exposed. As shown in FIG. 4G, a first silicon oxide layer 451 is formed on the exposed sidewall in the trench by thermal process to protect the upper sidewall of the trench (DT), enhancing the isolation between the n-type diffusion region 444 and the buried out diffusion region. More particularly, because the shield layer 454a avoids oxidation of the top substrate of the trench, the first silicon oxide layer 451 is only formed on the exposed surface out of the shield layer 454a.

One advantage of the present invention is that the top width of the trench is not enlarged during the follow wet etching when the sacrificial layer is formed on the top sidewall of the trench.

While the invention has been described by way of example and in terms of the preferred embodiments, it is to be understood that the invention is not limited to the disclosed embodiments. To the contrary, it is intended to cover various modifications and similar arrangements (as would be apparent to those skilled in the art). Therefore, the scope of thee appended claims should be accorded the broadest interpretation so as to encompass all such modifications and similar arrangements.

What is claimed is:

1. A method for controlling a top width of a trench, comprising the steps of:
    providing a substrate, having a trench formed therein;
    forming a conductive layer in a portion of the trench;
    forming an interval layer in a portion of the trench, wherein the interval layer is formed over the conductive layer;
    forming a sacrificial layer on a sidewall of a top portion of the trench and on the interval layer;
    etching the sacrificial layer to remove a portion of the sacrificial layer on the interval layer;
    removing the interval layer to expose a sidewall of a portion of the trench which is uncovered by the sacrificial layer and the conductive layer; and
    oxidizing the sacrificial layer and the exposed sidewall of the trench to form a first silicon oxide layer.

2. The method according to claim 1, wherein the substrate is a single crystal silicon substrate.

3. The method according to claim 1, wherein the step of forming the conductive layer further comprises depositing the conductive layer over the substrate and in the trench and etching back the conductive layer, which in a top of the recessed conductive layer is below a surface of the substrate.

4. The method according to claim 1, wherein the conductive layer is formed of polysilicon.

5. The method according to claim 1, wherein the trench further comprises a capacitor.

6. The method according to claim 1, wherein the interval layer is formed of TEOS.

7. The method according to claim 1, wherein the steps of forming the interval layer further comprises depositing the interval layer on the substrate and in the trench and etching back the interval layer, wherein a top of the interval layer is below a surface of the substrate.

8. The method according to claim 1, wherein the sacrificial layer is formed of polysilicon.

9. The method according to claim 1, wherein a depth of the trench is between 5000 nm~9000 nm.

10. A method for controlling an upper width of a trench, comprising:
    providing a substrate, further comprising a trench;
    forming a conductive layer in a portion of the trench;
    forming an interval layer in a portion of the trench, wherein the interval layer is over the conductive layer;
    forming a protective layer on a sidewall of the trench over the interval layer;
    removing the interval layer, exposing a sidewall of the trench over the conductive layer;
    oxidizing the trench sidewall, wherein a top portion of the trench is protected by the protective layer from oxidizing to form a first silicon oxide layer on the exposed sidewall of the trench and the protective layer;
    forming a second silicon oxide layer on the first silicon oxide layer, wherein the first and second oxide layers acting as collar dielectric layer;
    depositing an upper conductive layer on the second silicon oxide layer;
    recessing the second silicon oxide layer; and
    etching the collar dielectric layer to expose a portion of the upper conductive layer adjacent to the sidewall of the trench.

* * * * *